(12) United States Patent
Omura

(10) Patent No.: US 11,509,281 B2
(45) Date of Patent: Nov. 22, 2022

(54) ACOUSTIC WAVE DEVICE

(71) Applicant: Murata Manufacturing Co., Ltd., Nagaokakyo (JP)

(72) Inventor: Masashi Omura, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 490 days.

(21) Appl. No.: 16/823,440

(22) Filed: Mar. 19, 2020

(65) Prior Publication Data
US 2020/0220518 A1 Jul. 9, 2020

Related U.S. Application Data

(63) Continuation of application No. PCT/JP2018/035552, filed on Sep. 26, 2018.

(30) Foreign Application Priority Data

Sep. 27, 2017 (JP) .............................. JP2017-186734

(51) Int. Cl.
*H03H 9/02* (2006.01)
*H01L 41/047* (2006.01)
(Continued)

(52) U.S. Cl.
CPC ..... *H03H 9/02228* (2013.01); *H01L 41/0477* (2013.01); *H03H 9/02842* (2013.01);
(Continued)

(58) Field of Classification Search
CPC ........... H03H 9/02228; H03H 9/02842; H03H 9/131; H03H 9/14541; H01L 41/0477
See application file for complete search history.

(56) References Cited

U.S. PATENT DOCUMENTS

2012/0074811 A1* 3/2012 Pang ...................... H03H 9/589
29/25.35
2014/0152146 A1 6/2014 Kimura et al.
(Continued)

FOREIGN PATENT DOCUMENTS

WO 2012/086441 A1 6/2012
WO 2016/052129 A1 4/2016
(Continued)

OTHER PUBLICATIONS

Official Communication issued in International Patent Application No. PCT/JP2018/035552 dated Dec. 4, 2018.

*Primary Examiner* — Bryan P Gordon
(74) *Attorney, Agent, or Firm* — Keating & Bennett, LLP

(57) ABSTRACT

An acoustic wave device includes first and second IDT electrodes electrically connected in series with each other by a common busbar common to the first and second IDT electrodes. In each of a first acoustic impedance layer and a second acoustic impedance layer, at least one of at least one high acoustic impedance layer and at least one low acoustic impedance layer is a conductive layer. At least a portion of the conductive layer in the first acoustic impedance layer and at least a portion of the conductive layer in the second acoustic impedance layer do not overlap with the common busbar when viewed in plan from a thickness direction of a piezoelectric layer. The conductive layer in the first acoustic impedance layer and the conductive layer in the second acoustic impedance layer are electrically insulated from each other.

18 Claims, 17 Drawing Sheets

(51) Int. Cl.
*H03H 9/13* (2006.01)
*H03H 9/145* (2006.01)
*H03H 9/205* (2006.01)

(52) U.S. Cl.
CPC ........ *H03H 9/131* (2013.01); *H03H 9/14541* (2013.01); *H03H 9/205* (2013.01)

(56) References Cited

U.S. PATENT DOCUMENTS

| | | | |
|---|---|---|---|
| 2016/0336919 A1* | 11/2016 | Taniguchi | H03H 9/02559 |
| 2017/0187352 A1 | 6/2017 | Omura | |
| 2017/0201228 A1 | 7/2017 | Kuzushita | |
| 2017/0250671 A1* | 8/2017 | Omura | H03H 3/08 |
| 2017/0366163 A1 | 12/2017 | Kishimoto | |
| 2018/0091116 A1 | 3/2018 | Kai | |
| 2019/0165758 A1* | 5/2019 | Sakai | H03H 9/02834 |
| 2019/0363692 A1* | 11/2019 | Nosaka | H03H 9/14541 |

FOREIGN PATENT DOCUMENTS

| | | |
|---|---|---|
| WO | 2016/063718 A1 | 4/2016 |
| WO | 2016/147986 A1 | 9/2016 |
| WO | 2016/208427 A1 | 12/2016 |

* cited by examiner

ACOUSTIC WAVE DEVICE

CROSS REFERENCE TO RELATED APPLICATIONS

This application claims the benefit of priority to Japanese Patent Application No. 2017-186734 filed on Sep. 27, 2017 and is a Continuation Application of PCT Application No. PCT/JP2018/035552 filed on Sep. 26, 2018. The entire contents of each application are hereby incorporated herein by reference.

BACKGROUND OF THE INVENTION

1. Field of the Invention

The present invention generally relates to acoustic wave devices, and more particularly, to an acoustic wave device that includes a piezoelectric layer.

2. Description of the Related Art

Acoustic wave devices using plate waves have been known as acoustic wave devices (see, for example, International Publication No. 2012/086441).

An acoustic wave device described in International Publication No. 2012/086441 includes a supporting substrate, an acoustic reflection layer (acoustic impedance layer), a piezoelectric layer, and an IDT (Interdigital Transducer) electrode.

The acoustic reflection layer of the acoustic wave device described in International Publication No. 2012/086441 includes a low acoustic impedance layer and a high acoustic impedance layer with an acoustic impedance higher than that of the low acoustic impedance layer.

International Publication No. 2012/086441 mentions that, in order to efficiently cause acoustic waves to be reflected in the acoustic reflection layer, it is desirable that an acoustic impedance ratio, which is a ratio of an acoustic impedance of the high acoustic impedance layer to an acoustic impedance of the low acoustic impedance layer, is large. Furthermore, in International Publication No. 2012/086441, as a combination of materials exhibiting the maximum acoustic impedance ratio, a combination of W (tungsten) and $SiO_2$ (silicon oxide) is disclosed.

In an area of acoustic wave devices including IDT electrodes, it is desired to maintain excellent frequency characteristics and further increase electric power handling capability.

SUMMARY OF THE INVENTION

Preferred embodiments of the present invention provide acoustic wave devices that are each able to significantly reduce degradation in frequency characteristics and significantly increase electric power handling capability.

An acoustic wave device according to a preferred embodiment of the present invention includes a substrate, a first acoustic impedance layer, a second acoustic impedance layer, a piezoelectric layer, a first IDT electrode, and a second IDT electrode. The first acoustic impedance layer and the second acoustic impedance layer are provided on the substrate. The piezoelectric layer is provided on the first acoustic impedance layer and the second acoustic impedance layer. The first IDT electrode is provided on the piezoelectric layer and partially overlaps with the first acoustic impedance layer when viewed in plan from a thickness direction of the piezoelectric layer. The second IDT electrode is provided on the piezoelectric layer and partially overlaps with the second acoustic impedance layer when viewed in plan from the thickness direction. The first IDT electrode and the second IDT electrode are electrically connected in series with each other by a common busbar that is common to the first IDT electrode and the second IDT electrode. The first IDT electrode includes a first busbar and the common busbar that face each other, a plurality of electrode fingers that are connected to the first busbar and extend towards the common busbar, and a plurality of electrode fingers that are connected to the common busbar and extend towards the first busbar. The second IDT electrode includes the common busbar and a second busbar that face each other, a plurality of electrode fingers that are connected to the common busbar and extend towards the second busbar, and a plurality of electrode fingers that are connected to the second busbar and extend towards the common busbar. Each of the first acoustic impedance layer and the second acoustic impedance layer includes at least one high acoustic impedance layer, and at least one low acoustic impedance layer with an acoustic impedance lower than that of the at least one high acoustic impedance layer. In each of the first acoustic impedance layer and the second acoustic impedance layer, at least one of the at least one high acoustic impedance layer and the at least one low acoustic impedance layer is a conductive layer. At least a portion of the conductive layer in the first acoustic impedance layer and at least a portion of the conductive layer in the second acoustic impedance layer do not overlap with the common busbar when viewed in plan from the thickness direction. The conductive layer in the first acoustic impedance layer and the conductive layer in the second acoustic impedance layer are electrically insulated from each other.

With acoustic wave devices according to preferred embodiments of the present invention, degradation in frequency characteristics is able to be significantly reduced, and electric power handling capability is able to be further significantly increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
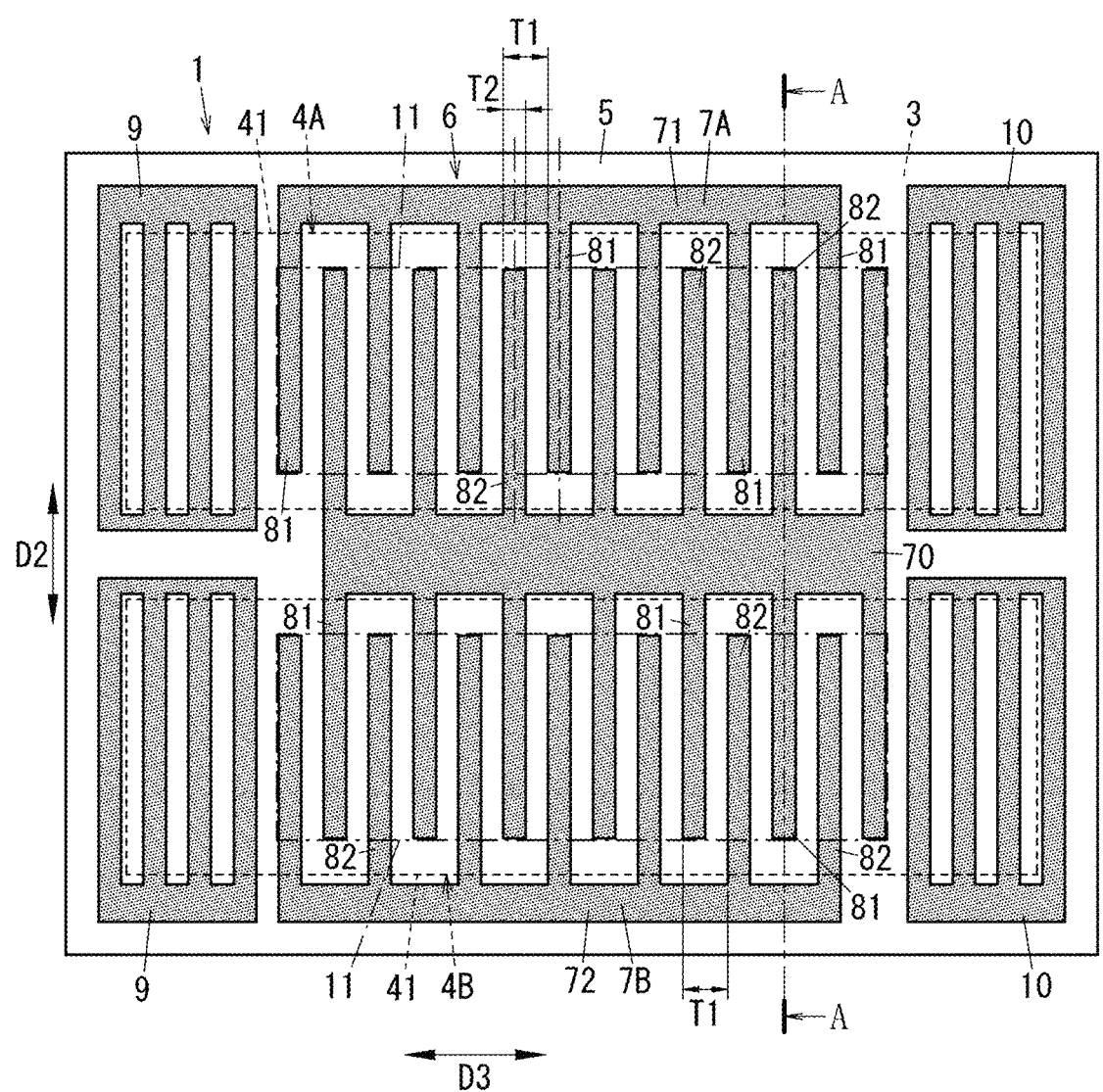
FIG. 1 is a plan view of an acoustic wave device according to a preferred embodiment of the present invention.

Hereinafter, acoustic wave devices according to preferred embodiments of the present invention will be described with reference to drawings.

FIGS. 1 to 4, FIGS. 6 to 11, and FIGS. 13 to 21, which will be referred to in a preferred embodiment and so on below, are diagrams, and ratios of sizes and thicknesses of component elements in the drawings do not necessarily reflect the actual dimension ratios.

PREFERRED EMBODIMENT

(1) Entire Configuration of Acoustic Wave Device

An acoustic wave device 1 according to a preferred embodiment will be described below with reference to drawings.

Figure 2:
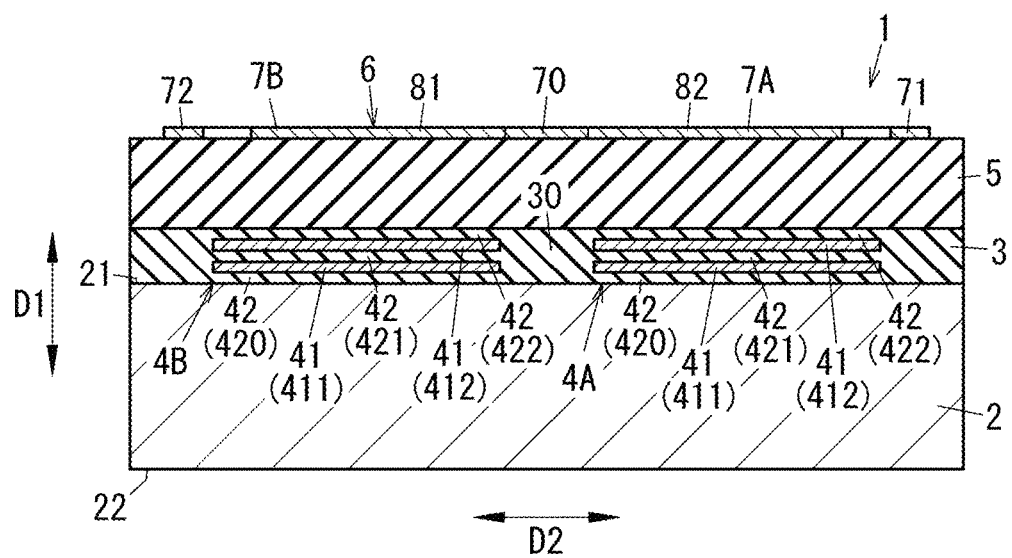
FIG. 2 is a cross-sectional view of the acoustic wave device taken along line A-A in FIG. 1.

The acoustic wave device 1 according to a preferred embodiment uses plate waves. The acoustic wave device 1 includes, as shown in FIGS. 1 and 2, a substrate 2, a first acoustic impedance layer 4A, a second acoustic impedance layer 4B, a piezoelectric layer 5, a first IDT electrode 7A, and a second IDT electrode 7B. The first acoustic impedance layer 4A and the second acoustic impedance layer 4B are provided on the substrate 2. The piezoelectric layer 5 is provided on the first acoustic impedance layer 4A and the second acoustic impedance layer 4B. The first IDT electrode 7A and the second IDT electrode 7B are provided on the piezoelectric layer 5. That is, in the acoustic wave device 1, a functional electrode 6 including the first IDT electrode 7A and the second IDT electrode 7B is provided on the piezoelectric layer 5.

The first IDT electrode 7A and the second IDT electrode 7B are electrically connected in series with each other by a common busbar 70 that is common to the first IDT electrode 7A and the second IDT electrode 7B. The first IDT electrode 7A and the second IDT electrode 7B are aligned in a second direction D2 that is orthogonal or substantially orthogonal to a thickness direction D1 of the substrate 2 (hereinafter, may be referred to as a first direction D1). Hereinafter, a direction that is orthogonal or substantially orthogonal to the first direction D1 and the second direction D2 will be referred to as a third direction D3. The third direction D3 is a direction along a direction in which acoustic waves (in the present preferred embodiment, plate waves) propagate.

Furthermore, the acoustic wave device 1 further includes two reflectors 9 provided on one side of the first IDT electrode 7A and the second IDT electrode 7B in the third direction D3 and two reflectors 10 provided on the other side of the first IDT electrode 7A and the second IDT electrode 7B in the third direction D3. In FIG. 1, dotted hatching is provided for the first IDT electrode 7A, the second IDT electrode 7B, the reflectors 9, and the reflectors 10. However, the hatching does not represent a cross section. The hatching is merely provided for easier understanding of the relationship between the first IDT electrode 7A, the second IDT electrode 7B, the reflectors 9, and the reflectors 9, and the first acoustic impedance layer 4A and the second acoustic impedance layer 4B.

(2) Component Elements of Acoustic Wave Device

Next, component elements of the acoustic wave device 1 will be described with reference to the drawings.

(2.1) Substrate

The substrate 2 supports, as shown in FIG. 2, a multilayer body including the first acoustic impedance layer 4A, the second acoustic impedance layer 4B, the piezoelectric layer 5, the first IDT electrode 7A, and the second IDT electrode 7B. Hereinafter, in the multilayer body, a layer including the first acoustic impedance layer 4A and the second acoustic impedance layer 4B and located between the substrate 2 and the piezoelectric layer 5 is referred to as an intermediate layer 3. The substrate 2 includes a first main surface 21 and a second main surface 22 that are opposite to each other in the thickness direction D1. The first main surface 21 and the second main surface 22 are provided back to back. A plan-view shape of the substrate 2 (an outer peripheral shape of the substrate 2 when viewed from the thickness direction D1) is a rectangular or substantially rectangular shape. However, the plan-view shape of the substrate 2 is not necessarily a rectangular or substantially orthogonal shape and may be, for example, a square or substantially square shape. The substrate 2 is preferably, for example, a silicon substrate. The thickness of the substrate 2 is preferably, for example, equal to or more than about 10λ (λ: a wave length of acoustic waves defined by 2×T1, which is an electrode finger pitch) μm and less than or equal to about 180 μm. The substrate 2 may have any thickness, for example, 20 μm, 30

μm, 40 μm, 50 μm, 60 μm, 70 μm, 80 μm, 90 μm, 100 μm, 110 μm, 120 μm, 130 μm, 140 μm, 150 μm, 160 μm, 170 μm, 180 μm, or the like. Furthermore, recessed and protruding portions may be provided at a surface of the silicon substrate on the piezoelectric layer 5 side. Accordingly, in the acoustic wave device 1, unwanted waves are scattered and unwanted waves are thus able to be significantly reduced. Preferably, the height difference between the recessed and protruding portions is ¼ λ or less, for example. The outline shapes of the recessed and protruding portions are appropriately selected from among a triangle, an arc, a rectangle, and the like. The resistivity of the silicon substrate is preferably, for example, equal to or more than about 100 Ωcm and less than or equal to about 1,000 Ωcm. More preferably, the resistivity of the silicon substrate is equal to or more than about 4,000 Ωcm, for example. As the face orientation of the silicon substrate on the piezoelectric layer 5 side, for example, (100) plane, (111) plane, (110) plane, and (551) plane may be used. A direction in which acoustic waves propagate may be set without being constrained by the face orientation of the silicon substrate.

(2.2) First Acoustic Impedance Layer and Second Acoustic Impedance Layer

The first acoustic impedance layer 4A and the second acoustic impedance layer 4B are provided on the first main surface 21 of the substrate 2, as shown in FIG. 2. The first acoustic impedance layer 4A faces the first IDT electrode 7A in the thickness direction D1 of the substrate 2. The second acoustic impedance layer 4B faces the second IDT electrode 7B in the thickness direction D1 of the substrate 2. The first acoustic impedance layer 4A significantly reduces leakage of acoustic waves excited by the first IDT electrode 7A to the substrate 2. The second acoustic impedance layer 4B significantly reduces leakage of acoustic waves excited by the second IDT electrode 7B to the substrate 2. Furthermore, the acoustic wave device 1 further includes an insulating layer 30 that is located between the first acoustic impedance layer 4A and the second acoustic impedance layer 4B on the substrate 2. The insulating layer 30 is provided on the substrate 2. The insulating layer 30 is included in the multilayer body described above. The first acoustic impedance layer 4A and the second acoustic impedance layer 4B each have a multilayer structure in which a plurality of (three) low acoustic impedance layers 42 and a plurality of (two) high acoustic impedance layers 41 are provided alternately one by one in the thickness direction D1. The acoustic impedance of the low acoustic impedance layers is lower than the acoustic impedance of the high acoustic impedance layers 41.

The first acoustic impedance layer 4A and the second acoustic impedance layer 4B are interposed between the substrate 2 and the piezoelectric layer 5. Hereinafter, for convenience of explanation, in each of the first acoustic impedance layer 4A and the second acoustic impedance layer 4B, the two high acoustic impedance layers 41 may be referred to as a high acoustic impedance layer 411 and a high acoustic impedance layer 412 in an order from the closest to the first main surface 21 of the substrate 2. Furthermore, the three low acoustic impedance layers 42 may be referred to as a low acoustic impedance layer 420, a low acoustic impedance layer 421, and a low acoustic impedance layer 422 in an order from the closest to the first main surface 21 of the substrate 2.

In each of the first acoustic impedance layer 4A and the second acoustic impedance layer 4B, the low acoustic impedance layer 420, the high acoustic impedance layer 411, the low acoustic impedance layer 421, the high acoustic impedance layer 412, and the low acoustic impedance layer 422 are provided in this order from the substrate 2 side. Thus, in each of the first acoustic impedance layer 4A and the second acoustic impedance layer 4B, acoustic waves (plate waves) from the piezoelectric layer 5 can be reflected at the interface between the low acoustic impedance layer 422 and the high acoustic impedance layer 412, the interface between the low acoustic impedance layer 421 and the high acoustic impedance layer 411, and the interface between the high acoustic impedance layer 411 and the low acoustic impedance layer 420. In the present preferred embodiment, the insulating layer 30 is a region of the intermediate layer 3, which is interposed between the substrate 2 and the piezoelectric layer 5, other than the first acoustic impedance layer 4A and the second acoustic impedance layer 4B (region not including the first acoustic impedance layer 4A and the second acoustic impedance layer 4B). The insulating layer 30 is made of the same or substantially the same material as the low acoustic impedance layers 42. The insulating layer 30 has electrical insulation characteristics.

In each of the first acoustic impedance layer 4A and the second acoustic impedance layer 4B, a material for the plurality of high acoustic impedance layers 41 is preferably, for example, Pt (platinum). A material for the plurality of low acoustic impedance layers 42 is preferably, for example, $SiO_2$ (silicon oxide). Each of the plurality of high acoustic impedance layers 41 is made of Pt. Therefore, each of the first acoustic impedance layer 4A and the second acoustic impedance layer 4B includes two conductive layers.

Each of the low acoustic impedance layers 42 may not be a single layer. The low acoustic impedance layer 42 may have a multilayer structure including a plurality of layers made of a material with a relatively low acoustic impedance. Furthermore, the low acoustic impedance layer 42 may have a multilayer structure including a metal layer of, for example, titanium, nickel, or the like interposed between a plurality of layers. Surfaces on the piezoelectric layer 5 side and surfaces on the substrate 2 side of the intermediate layer 3, the metal layer in the low acoustic impedance layer 42 including a plurality of layers, and the low acoustic impedance layers 42 preferably have smaller surface roughness, for example, (e.g., an arithmetic average roughness Ra defined by JIS B 0601-2001, ISO 4287-1997, or the like). Specifically, the surface roughness is preferably less than or equal to about 100 nm, and is appropriately selected from among, for example, 90 nm, 80 nm, 70 nm, 60 nm, 50 nm, 40 nm, 30 nm, 20 nm, 10 nm, 5 nm, 1 nm, and the like.

Similarly, each of the high acoustic impedance layers 41 may not be a single layer. The high acoustic impedance layer 41 may have a multilayer structure including a plurality of layers made of a material with a relatively high acoustic impedance. Furthermore, the high acoustic impedance layer 41 may have a multilayer structure including a metal layer of, for example, titanium, nickel, or the like located between a plurality of layers. Surfaces on the piezoelectric layer 5 side and surfaces on the substrate 2 side of the metal layer in the high acoustic impedance layer 41 including a plurality of layers and the high acoustic impedance layers 41 preferably have smaller surface roughness, for example (e.g., an arithmetic average roughness Ra). Specifically, the surface roughness is preferably less than or equal to about 100 nm, and is appropriately selected from among, for example, 90 nm, 80 nm, 70 nm, 60 nm, 50 nm, 40 nm, 30 nm, 20 nm, 10 nm, 5 nm, 1 nm, and the like.

(2.3) Piezoelectric Layer

The piezoelectric layer 5 is preferably made of, for example, $LiNbO_3$ piezoelectric single crystal.

The thickness of the piezoelectric layer 5 is preferably 1λ or less, where the wave length of acoustic waves defined by the electrode finger pitch (2×T1) of the first IDT electrode 7A and the second IDT electrode 7B is represented by λ. Accordingly, in the acoustic wave device 1, plate waves are excited by each of the first IDT electrode 7A and the second IDT electrode 7B, and the plate waves thus propagate. The electrode finger pitch (2×T1) will be explained below in a column "(2.4) First IDT Electrode, Second IDT Electrode, and Reflectors". In the acoustic wave device 1 according to the present preferred embodiment, for example, the wave length of acoustic waves is about 1.7 μm, and the thickness of the piezoelectric layer 5 is about 340 nm. The first IDT electrode 7A and the second IDT electrode 7B may be provided on either a positive surface or a negative surface in a polarization axis direction of the piezoelectric layer 5. In other words, a main surface of the piezoelectric layer 5 on the first IDT electrode 7A and second IDT electrode 7B side may be the positive surface or the negative surface in the polarization axis direction of the piezoelectric layer 5. The positive surface in the polarization axis direction represents a surface in the direction that the positive side of a polarization component in the piezoelectric layer 5 surfaces. The negative surface in the polarization axis direction represents a surface in the direction that the negative side of a polarization component in the piezoelectric layer 5 surfaces.

(2.4) First IDT Electrode, Second IDT Electrode, and Reflectors

The first IDT electrode 7A, the second IDT electrode 7B, the reflectors 9, and the reflectors 10 are provided on the piezoelectric layer 5. More specifically, the first IDT electrode 7A, the second IDT electrode 7B, the reflectors 9, and the reflectors 10 are provided on the main surface of the piezoelectric layer 5 that is opposite the intermediate layer 3 side. The first IDT electrode 7A, the second IDT electrode 7B, the reflectors 9, and the reflectors 10 each have a conductivity. Materials for the first IDT electrode 7A, the second IDT electrode 7B, the reflectors 9, and the reflectors 10 are preferably, for example, Al. The first IDT electrode 7A, the second IDT electrode 7B, the reflectors 9, and the reflectors 10 each preferably have a thickness of, for example, about 85 nm.

The first IDT electrode 7A and the second IDT electrode 7B are electrically connected in series with each other by the common busbar 70 that is common to the first IDT electrode 7A and the second IDT electrode 7B. Therefore, the functional electrode 6 includes the first IDT electrode 7A and the second IDT electrode 7B that are electrically connected in series with each other. The first IDT electrode 7A includes a first busbar 71 and the common busbar 70 that face each other, a plurality of electrode fingers 81 connected to the first busbar 71, and a plurality of electrode fingers 82 connected to the common busbar 70. The second IDT electrode 7B includes the common busbar 70 and a second busbar 72 that face each other, the plurality of electrode fingers 81 connected to the common busbar 70, and the plurality of electrode fingers 82 connected to the second busbar 72.

The first busbar 71, the common busbar 70, and the second busbar 72 have a long shape in which a longitudinal direction is defined as the third direction D3.

In the first IDT electrode 7A, the first busbar 71 and the common busbar 70 face each other in the second direction D2. In the first IDT electrode 7A, the plurality of electrode fingers 81 are connected to the first busbar 71 and extend towards the common busbar 70. In the first IDT electrode 7A, the plurality of electrode fingers 81 extend from the first busbar 71 along the second direction D2. Leading ends of the plurality of electrode fingers 81 and the common busbar 70 are separated from each other. The widths of the plurality of electrode fingers 81 in the third direction D3 are preferably the same or substantially the same. Furthermore, the lengths of the plurality of electrode fingers 81 in the second direction D2 are preferably the same or substantially the same.

In the first IDT electrode 7A, the plurality of electrode fingers 82 are connected to the common busbar 70 and extend towards the first busbar 71. In the first IDT electrode 7A, the plurality of electrode fingers 82 extend from the common busbar 70 along the second direction D2. Leading ends of the plurality of electrode fingers 82 and the first busbar 71 are separated from each other. The widths of the plurality of electrode fingers 82 in the third direction D3 are preferably the same or substantially the same. Furthermore, the lengths of the plurality of electrode fingers 82 in the second direction D2 are the same or substantially the same. The widths and lengths of the plurality of electrode fingers 82 are preferably the same or substantially the same as the widths and lengths of the plurality of electrode fingers 81.

In the second IDT electrode 7B, the common busbar 70 and the second busbar 72 face each other in the second direction D2. In the second IDT electrode 7B, the plurality of electrode fingers 81 are connected to the common busbar 70 and extend towards the second busbar 72. In the second IDT electrode 7B, the plurality of electrode fingers 81 extend from the common busbar 70 along the second direction D2. Leading ends of the plurality of electrode fingers 81 and the second busbar 72 are separated from each other. The widths of the plurality of electrode fingers 81 in the third direction D3 are preferably the same or substantially the same. Furthermore, the lengths of the plurality of electrode fingers 81 in the second direction D2 are preferably the same or substantially the same.

In the second IDT electrode 7B, the plurality of electrode fingers 82 are connected to the second busbar 72 and extend towards the common busbar 70. In the second IDT electrode 7B, the plurality of electrode fingers 82 extend from the second busbar 72 along the second direction D2. Leading ends of the plurality of electrode fingers 82 and the common busbar 70 are separated from each other. The widths of the plurality of electrode fingers 82 in the third direction D3 are preferably the same or substantially the same. Furthermore, the lengths of the plurality of electrode fingers 82 in the second direction D2 are preferably the same or substantially the same. The widths and lengths of the plurality of electrode fingers 82 are preferably the same or substantially the same as the widths and lengths of the plurality of electrode fingers 81.

In the first IDT electrode 7A, the plurality of electrode fingers 81 and the plurality of electrode fingers 82 are provided alternately one by one and separately from one another in a direction (third direction D3) orthogonal or substantially orthogonal to a direction (second direction D2) in which the first busbar 71 and the common busbar 70 face each other. Furthermore, in the second IDT electrode 7B, the plurality of electrode fingers and the plurality of electrode fingers 82 are provided alternately one by one and separately from one another in the direction (third direction D3) orthogonal or substantially orthogonal to the direction (second direction D2) in which the common busbar 70 and the second busbar 72 face each other. Therefore, in each of the first IDT electrode 7A and the second IDT electrode 7B, an electrode finger 81 and an electrode finger 82 that are adjacent to each other in the third direction D3 are separated from each other. As shown in FIG. 1, an electrode finger pitch (2×T1) of each of the first IDT electrode 7A and the second IDT electrode 7B is twice a distance T1 between corresponding sides of the electrode finger 81 and the electrode finger 82 that are adjacent to each other in the third direction D3 (left sides parallel or substantially parallel to center lines of the electrode finger 81 and the electrode finger 82 in FIG. 1). A value obtained by dividing an electrode finger width T2 (see FIG. 1) by the distance T1 (duty ratio) is about 0.5. The electrode finger width T2 represents the width of each of the electrode finger 81 and the electrode finger 82.

The electrode finger pitch (2×T1) of the first IDT electrode 7A and the electrode finger pitch (2×T1) of the second IDT electrode 7B are preferably the same or substantially the same.

In the functional electrode 6, as shown in FIG. 1, the plurality of electrode fingers 81 in the first IDT electrode 7A and the plurality of electrode fingers 82 in the second IDT electrode 7B are provided in line symmetry with respect to the common busbar 70 as an axis of symmetry. Furthermore, in the functional electrode 6, the plurality of electrode fingers 82 in the first IDT electrode 7A and the plurality of electrode fingers 81 in the second IDT electrode 7B are provided in line symmetry with respect to the common busbar 70 as an axis of symmetry. That is, the functional electrode 6 in the acoustic wave device 1 has a line symmetrical configuration in which a center line along the third direction D3 of the common busbar 70 defines and functions as an axis of symmetry.

A prescribed region 11 indicated by an alternate long and short dash line in FIG. 1 of each of the first IDT electrode 7A and the second IDT electrode 7B excites acoustic waves (plate waves). The prescribed regions 11 are regions in which the plurality of electrode fingers 81 and the plurality of electrode fingers 82 overlap in the third direction D3. The prescribed region 11 is a region surrounded by sides of the electrode finger 81 and the electrode finger 82 on both sides in the third direction D3, the sides being opposite to each other, an envelope of leading ends of the plurality of electrode fingers 81, and an envelope of leading ends of the plurality of electrode fingers 82.

Each of the reflectors 9 and each of the reflectors 10 are preferably grating reflectors. One of the two reflectors 9 is provided on one side of the first IDT electrode 7A in the third direction D3 (on the left side, in FIG. 1). One of the two reflectors 10 is provided on the other side of the first IDT electrode 7A in the third direction D3 (on the right side, in FIG. 1). The reflector 9 and the reflector 10 corresponding to the first IDT electrode 7A reflect acoustic waves excited by the first IDT electrode 7A and propagated. The other reflector 9 of the two reflectors 9 is provided on one side of the second IDT electrode 7B in the third direction D3 (on the left side, in FIG. 1). The other reflector 10 of the two reflectors 10 is provided on the other side of the second IDT electrode 7B in the third direction D3 (on the right side, in FIG. 1). The reflector 9 and the reflector 10 corresponding to the second IDT electrode 7B reflect acoustic waves excited by the second IDT electrode 7B and propagated.

(2.5) Layout of First IDT Electrode, Second IDT Electrode, First Acoustic Impedance Layer, and Second Acoustic Impedance Layer In the acoustic wave device 1 according to the present preferred embodiment, when viewed in plan from the thickness direction D1, the first IDT electrode 7A partially overlaps with the first acoustic impedance layer 4A and the second IDT electrode 7B partially overlaps with the second acoustic impedance layer 4B.

In the acoustic wave device 1, at least a portion (in the present preferred embodiment, the entire or substantially the entire) of the conductive layers (high acoustic impedance layers 41) in the first acoustic impedance layer 4A does not overlap with the common busbar 70 when viewed in plan from the thickness direction D1. Furthermore, in the acoustic wave device 1, at least a portion (in the present preferred embodiment, the entire or substantially the entire) of the conductive layers (high acoustic impedance layers 41) in the second acoustic impedance layer 4B does not overlap with the common busbar 70 when viewed in plan from the thickness direction D1. In the acoustic wave device 1, the conductive layers in the first acoustic impedance layer 4A and the conductive layers in the second acoustic impedance layer 4B are electrically insulated from each other. In the acoustic wave device 1, a portion of the insulating layer 30 is located between the conductive layers in the first acoustic impedance layer 4A and the conductive layers in the second acoustic impedance layer 4B.

In the acoustic wave device 1 according to the present preferred embodiment, when viewed in plan from the thickness direction D1, as shown in FIG. 1, the high acoustic impedance layers 41 (conductive layers) in the first acoustic impedance layer 4A and the high acoustic impedance layers 41 (conductive layers) in the second acoustic impedance layer 4B are separated from each other in the width direction of the common busbar 70 (second direction D2). In the acoustic wave device 1 according to the present preferred embodiment, when viewed in plan from the thickness direction D1, the high acoustic impedance layers 41 (conductive layers) in the first acoustic impedance layer 4A are located between the first busbar 71 and the common busbar 70 of the first IDT electrode 7A and are separated from the common busbar 70. Furthermore, in the acoustic wave device 1 according to the present preferred embodiment, when viewed in plan from the thickness direction D1, the high acoustic impedance layers 41 (conductive layers) in the second acoustic impedance layer 4B are located between the common busbar 70 and the second busbar 72 of the second IDT electrode 7B and are separated from the common busbar 70.

In short, in the acoustic wave device 1 according to the present preferred embodiment, when viewed in plan from the thickness direction D1, the high acoustic impedance layers 41 (conductive layers) in the first acoustic impedance layer 4A and the high acoustic impedance layers 41 (conductive layers) in the second acoustic impedance layer 4B do not overlap with the common busbar 70.

Furthermore, in the acoustic wave device 1, the entire or substantially the entire prescribed region 11 of the first IDT electrode 7A overlaps with the conductive layers overlapping with the first IDT electrode 7A. Furthermore, in the acoustic wave device 1, the entire or substantially the entire prescribed region 11 of the second IDT electrode 7B overlaps with the conductive layers overlapping with the second IDT electrode 7B. In the acoustic wave device 1, when viewed in plan from the thickness direction D1, the area of the region in which the first IDT electrode 7A and the conductive layers in the first acoustic impedance layer 4A overlap and the area of the region in which the second IDT electrode 7B and the conductive layers in the second acoustic impedance layer 4B overlap are preferably the same or substantially the same.

(2.6) Impedance of Acoustic Wave Device

As an example of frequency characteristics of the acoustic wave device 1, the frequency characteristics of impedance of the acoustic wave device 1 will be explained. The impedance of the acoustic wave device 1 is a combined impedance of an impedance of a first resonator including the first IDT electrode 7A, the piezoelectric layer 5, and the first acoustic impedance layer 4A and an impedance of a second resonator including the second IDT electrode 7B, the piezoelectric layer 5, and the second acoustic impedance layer 4B.

In the acoustic wave device 1, the impedance of the first resonator and the impedance of the second resonator are set, and an impedance of an acoustic wave device of a reference example that includes a resonator including an IDT electrode, a piezoelectric layer, and an acoustic impedance layer and the above-mentioned combined impedance are preferably the same or substantially the same. Thus, the first resonator and the second resonator of the acoustic wave device 1 may be regarded as division resonators (series division resonators) obtained by dividing the resonator of the acoustic wave device of the reference example into two resonators. In the acoustic wave device 1, the total area of the area of first resonator and the area of the second resonator is set to be larger than the area of the resonator of the acoustic wave device of the reference example. In the acoustic wave device 1, the number of pairs of the electrode finger 81 and the electrode finger 82 having different potentials is larger than the number of pairs of an electrode finger (corresponding to the electrode finger 81) and an electrode finger (corresponding to the electrode finger 82) in an IDT electrode of the acoustic wave device of the reference example.

Prior to explanation of the frequency characteristics of the acoustic wave device 1 according to the present preferred embodiment, an acoustic wave device 100 according to a first comparative example will be explained with reference to FIGS. 3 and 4.

The acoustic wave device 100 according to the first comparative example is different from the acoustic wave device 1 according to the present preferred embodiment in a pattern of an acoustic impedance layer 4 in the intermediate layer 3. Component elements of the acoustic wave device 100 according to the first comparative example similar to those of the acoustic wave device 1 according to the present preferred embodiment will be referred to with the same signs as those in the acoustic wave device 1 according to the present preferred embodiment, and explanation for similar component elements will be omitted.

Figure 3:
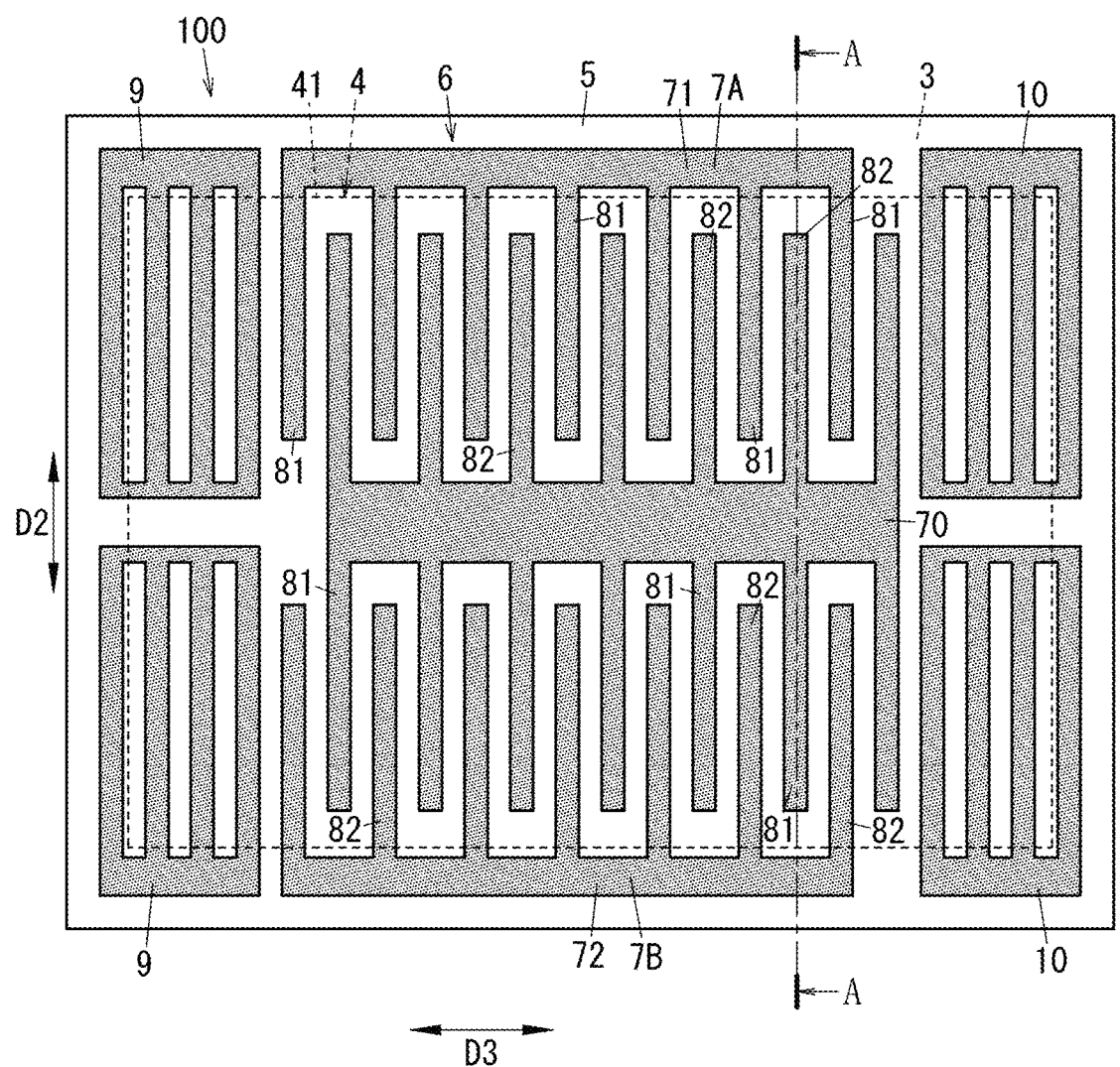
FIG. 3 is a plan view of an acoustic wave device according to a first comparative example.
Figure 4:
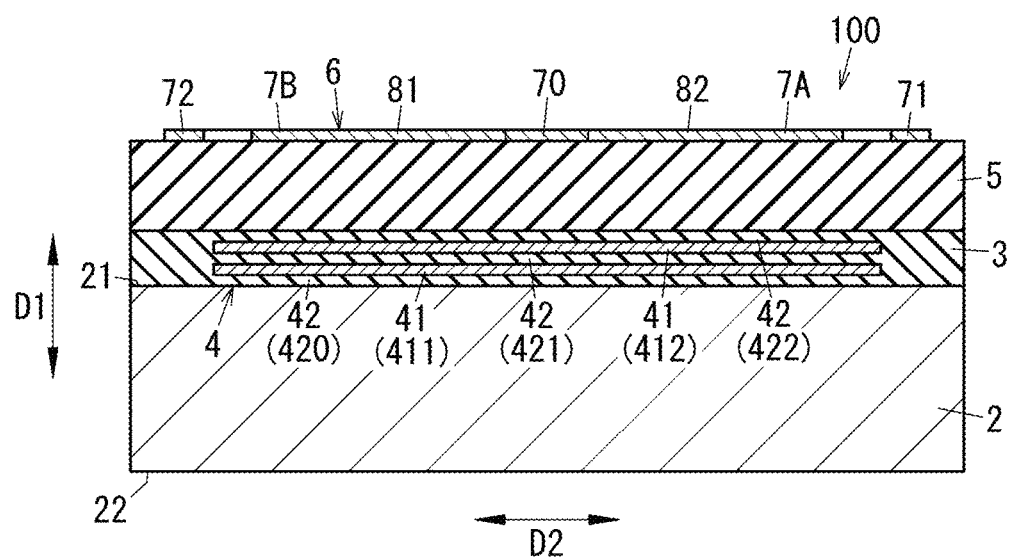
FIG. 4 is a cross-sectional view of the acoustic wave device taken along line A-A in FIG. 3.

In the acoustic wave device 100 according to the first comparative example, when viewed in plan from the thickness direction D1, as shown in FIG. 3, the acoustic impedance layer 4 has a size that overlaps with the first IDT electrode 7A and the second IDT electrode 7B and overlaps the common busbar 70.

Figure 5:
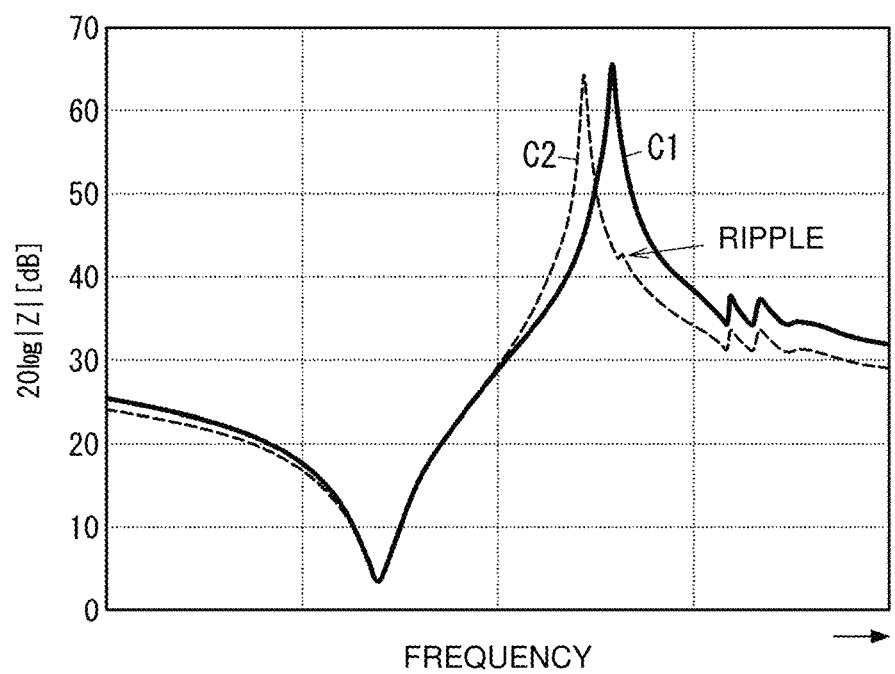
FIG. 5 is a graph of frequency characteristics of impedance of an acoustic wave device according to a preferred embodiment of the present invention and frequency characteristics of impedance of the acoustic wave device according to the first comparative example.

In FIG. 5, the frequency characteristics of impedance of the acoustic wave device 1 according to the present preferred embodiment are represented by a solid line C1, and the frequency characteristics of impedance of the acoustic wave device 100 according to the first comparative example are represented by a broken line C2. The frequency characteristics of the impedances indicated in FIG. 5 represent measurement results. In FIG. 5, the horizontal axis represents frequency, and the vertical axis represents 20 log|Z| where impedances of the acoustic wave device 1 according to the present preferred embodiment and the acoustic wave device 100 according to the first comparative example are represented by Z and the size of the impedances is represented by |Z|.

As is clear from FIG. 5, ripples are generated adjacent to or in a vicinity of a resonant frequency in the frequency characteristics of the impedance of the acoustic wave device 100 according to the first comparative example, and generation of ripples adjacent to or in a vicinity of a resonant frequency is significantly reduced or prevented in the acoustic wave device 1 according to the present preferred embodiment. Thus, the frequency characteristics in the acoustic wave device 1 according to the present preferred embodiment are significantly improved compared to the acoustic wave device 100 according to the first comparative example.

Furthermore, in the case where the acoustic wave device 1 according to the present preferred embodiment is applied to, for example, a ladder filter, a reduction in the pass band width is able to be significantly reduced or prevented compared to the case where the acoustic wave device 100 according to the first comparative example is applied to a ladder filter.

(3) Advantageous Effects

The acoustic wave device 1 according to the present preferred embodiment includes the substrate 2, the first acoustic impedance layer 4A, the second acoustic impedance layer 4B, the piezoelectric layer 5, the first IDT electrode 7A, and the second IDT electrode 7B. The first acoustic impedance layer 4A and the second acoustic impedance layer 4B are provided on the substrate 2. The piezoelectric layer 5 is provided on the first acoustic impedance layer 4A and the second acoustic impedance layer 4B. The first IDT electrode 7A is provided on the piezoelectric layer 5 and partially overlaps with the first acoustic impedance layer 4A when viewed in plan from the thickness direction D1 of the piezoelectric layer 5. The second IDT electrode 7B is provided on the piezoelectric layer 5 and partially overlaps with the second acoustic impedance layer 4B when viewed in plan from the thickness direction D1. The first IDT electrode 7A and the second IDT electrode 7B are electrically connected in series with each other by the common busbar 70 that is common to the first IDT electrode 7A and the second IDT electrode 7B. The first IDT electrode 7A includes the first busbar 71 and the common busbar 70 that face each other, the plurality of electrode fingers 81 connected to the first busbar 71 and extending towards the common busbar 70, and the plurality of electrode fingers 82 connected to the common busbar 70 and extending towards the first busbar 71. The second IDT electrode 7B includes the common busbar 70 and the second busbar 72 that face each other, the plurality of electrode fingers 81 connected to the common busbar 70 and extending towards the second busbar 72, and the plurality of electrode fingers 82 connected to the second busbar 72 and extending towards the common busbar 70. Each of the first acoustic impedance layer 4A and the second acoustic impedance layer 4B includes the high acoustic impedance layers 41 and the low acoustic impedance layers 42 with an acoustic impedance lower than that of the high acoustic impedance layers 41. In each of the first acoustic impedance layer 4A and the second acoustic impedance layer 4B, the high acoustic impedance layers 41 are conductive layers. At least a portion of the conductive layers (high acoustic impedance layers 41) in the first acoustic impedance layer 4A and at least a portion of the conductive layers (high acoustic impedance layers 41) in the second acoustic impedance layer 4B do not overlap with the common busbar when viewed in plan from the thickness direction D1. The conductive layers (high acoustic impedance layers 41) in the first acoustic impedance layer 4A and the conductive layers (high acoustic impedance layers 41) in the second acoustic impedance layer 4B are electrically insulated from each other. Accordingly, in the acoustic wave device 1 according to the present preferred embodiment, degradation in the frequency characteristics is able to be significantly reduced or prevented, and electric power handling capability is able to be further significantly increased. The acoustic wave device 1 according to the present preferred embodiment includes the first IDT electrode 7A and the second IDT electrode 7B, and the first IDT electrode 7A and the second IDT electrode 7B are electrically connected in series with each other by the common busbar 70 that is common to the first IDT electrode 7A and the second IDT electrode 7B. Therefore, compared to a configuration of the acoustic wave device described in International Publication No. 2012/086441 that includes only one IDT electrode, electric power handling capability is able to be further significantly increased. Herein, the "common busbar 70" is a component element common to the first IDT electrode 7A and the second IDT electrode 7B and is a conductive bar that allows the first IDT electrode 7A and the second IDT electrode 7B to be integrally provided, instead of electrically connecting the first IDT electrode 7A and the second IDT electrode 7B with different wiring. Accordingly, the first IDT electrode 7A and the second IDT electrode 7B are electrically connected in series with each other by the common busbar 70. Furthermore, the frequency characteristics of the acoustic wave device 1 according to the present preferred embodiment can be significantly improved, compared to the acoustic wave device 100 that includes the acoustic impedance layer 4 overlapping with the entire or substantially the entire common busbar 70 when viewed in plan from the thickness direction D1 as in the first comparative example.

A parasitic capacitance is generated between the common busbar 70 and a conductive layer in an acoustic impedance layer in a configuration in which the common busbar 70 and the conductive layer overlap as in the first comparative example, compared to a configuration in which a plurality of resonators are provided on a single substrate (a configuration in which a common busbar is not provided, an acoustic impedance layer including a conductive layer is provided on a substrate, a piezoelectric layer is provided on the acoustic impedance layer, and a plurality of separated IDT electrodes are provided on the piezoelectric layer). When such a parasitic capacitance is generated, capacitive coupling between both ends of a first resonator and a second resonator is caused by the parasitic capacitance, and a band width is thus significantly reduced. In contrast, a reduction in the band width is able to be significantly reduced or prevented in the acoustic wave device 1 according to the present preferred embodiment.

Furthermore, in the acoustic wave device 1 according to the present preferred embodiment, the plurality of high acoustic impedance layers 41 in each of the first acoustic impedance layer 4A and the second acoustic impedance layer 4B includes at least one conductive layer (high acoustic impedance layer 41). Accordingly, in the acoustic wave device 1 according to the present preferred embodiment, a material having a conductivity is not necessarily included as a material for the low acoustic impedance layers 42. Thus, an acoustic impedance ratio, which is a ratio of the acoustic impedance of the high acoustic impedance layers 41 to the acoustic impedance of the low acoustic impedance layers 42, is able to be further significantly increased.

Furthermore, in the acoustic wave device 1 according to the present preferred embodiment, the first IDT electrode 7A, the piezoelectric layer 5, and the first acoustic impedance layer 4A define the first resonator. The second IDT electrode 7B, the piezoelectric layer 5, and the second acoustic impedance layer 4B define the second resonator. The first resonator and the second resonator are division resonators obtained by dividing a prescribed resonator including an IDT electrode, a piezoelectric layer, and an acoustic impedance layer into two resonators, and a combined impedance of the impedance of the first resonator and the impedance of the second resonator is the same or substantially the same as the impedance of the prescribed resonator. Accordingly, in the acoustic wave device 1 according to the present preferred embodiment, the area of a region including the first resonator and the second resonator is larger than the area of the prescribed resonator. Therefore, heat dissipation increases. Thus, degradation in the frequency characteristics is able to be significantly reduced or prevented, and electric power handling capability is able to be further significantly increased.

Furthermore, in the acoustic wave device 1 according to the present preferred embodiment, the conductive layers (high acoustic impedance layers 41) in the first acoustic impedance layer 4A are located between the first busbar 71 and the common busbar 70 of the first IDT electrode 7A when viewed in plan from the thickness direction D1. Furthermore, the conductive layers (high acoustic impedance layers 41) in the second acoustic impedance layer 4B are located between the common busbar 70 and the second busbar 72 of the second IDT electrode 7B when viewed in plan from the thickness direction D1. Accordingly, in the acoustic wave device 1 according to the present preferred embodiment, degradation in the frequency characteristics is able to be further significantly reduced or prevented.

Furthermore, in the acoustic wave device 1 according to the present preferred embodiment, when viewed in plan from the thickness direction D1, the area (first area) of a region in which the first IDT electrode 7A and the conductive layers (high acoustic impedance layers 41) in the first acoustic impedance layer 4A overlap and the area (second area) of a region in which the second IDT electrode 7B and the conductive layers (high acoustic impedance layers 41) in the second acoustic impedance layer 4B overlap are the same or substantially the same. Herein, the term "same" does not necessarily represent exactly the same state but may represent substantially the same state (for example, the ratio of the second area to the first area is 100%±10%). Accordingly, in the acoustic wave device 1 according to the present preferred embodiment, a difference between the parasitic capacitance generated between the first IDT electrode 7A and the conductive layers in the first acoustic impedance layer 4A and the parasitic capacitance generated between the second IDT electrode 7B and the conductive layers in the second acoustic impedance layer 4B is able to be significantly reduced or prevented. Therefore, in the acoustic wave device 1 according to the present preferred embodiment, generation of ripples in the frequency characteristics of impedance is able to be further significantly reduced or prevented. Furthermore, in the acoustic wave device 1 according to the present preferred embodiment, electric power handling capability is able to be further significantly increased.

Furthermore, in the acoustic wave device 1 according to the present preferred embodiment, when the wave length of acoustic waves defined by the electrode finger pitch (2×T1) of the first IDT electrode 7A and the second IDT electrode 7B is represented by $\lambda$, the thickness of the piezoelectric layer 5 is preferably, for example, $1\lambda$ or less. Accordingly, in the acoustic wave device 1 according to the present preferred embodiment, plate waves can be excited.

Furthermore, in the acoustic wave device 1 according to the present preferred embodiment, plate waves are used as acoustic waves. Accordingly, the acoustic wave device 1 according to the present preferred embodiment may be used as an acoustic wave device that uses plate waves.

The foregoing preferred embodiment is merely one of preferred embodiments of the present invention. Various changes may be made to the foregoing preferred embodiment according to design and the like as long as the advantageous effects of the present invention are achieved.

(4) Modifications (4.1) First Modification

Figure 6:
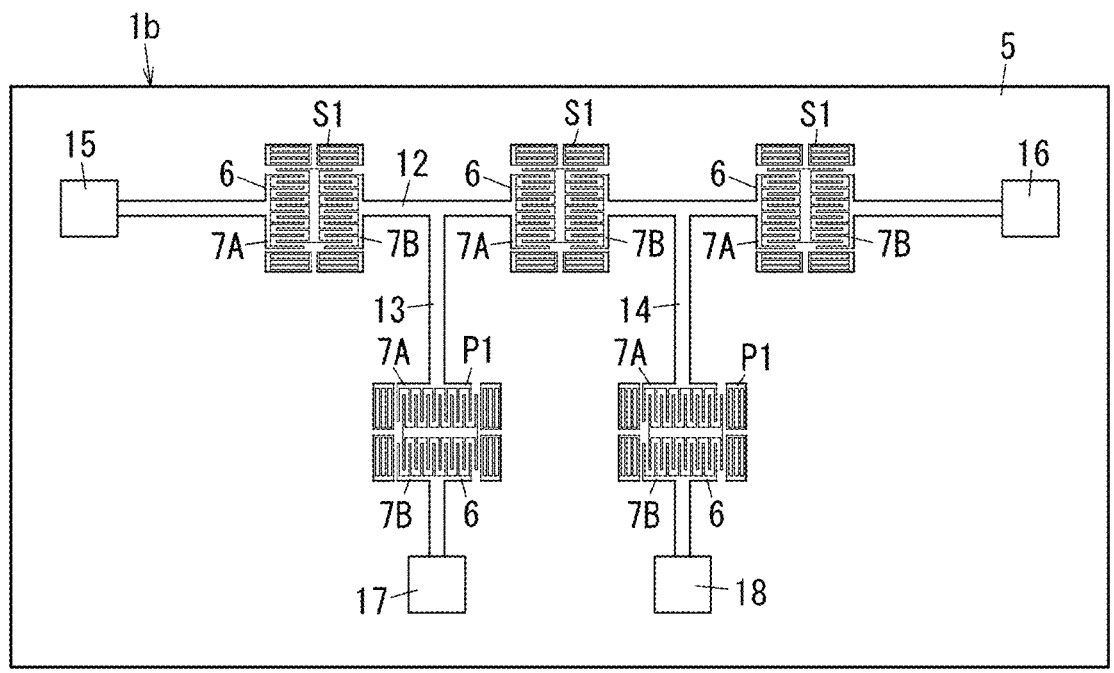
FIG. 6 is a plan view of an acoustic wave device according to a first modification of a preferred embodiment of the present invention.
Figure 7:
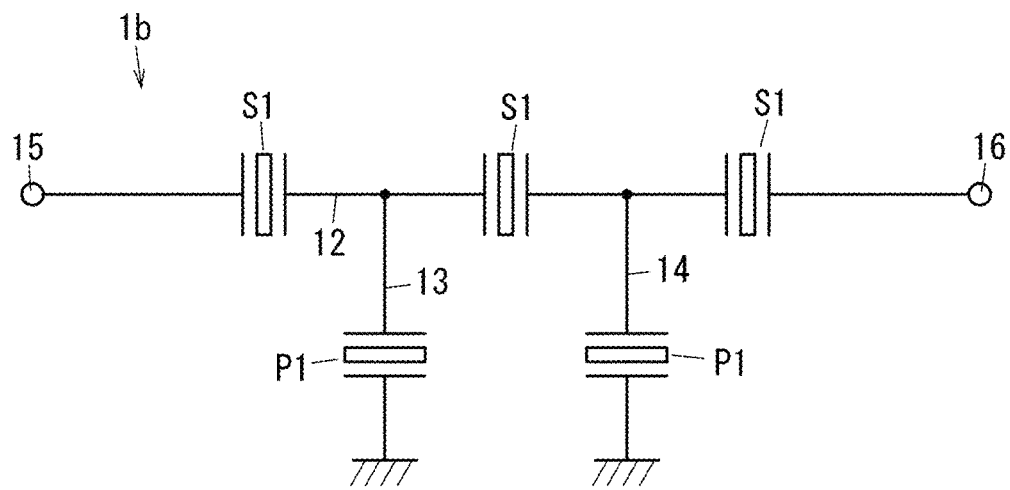
FIG. 7 is an equivalent circuit diagram of the acoustic wave device.

An acoustic wave device 1b according to a first modification of a preferred embodiment is different from the acoustic wave device 1 according to the preferred embodiment in that a plurality of (five) functional electrodes 6 are provided on the piezoelectric layer 5, as shown in FIGS. 6 and 7. In the acoustic wave device 1b according to the first modification, component elements the same as or similar to those in the acoustic wave device 1 according to the preferred embodiment will be referred to with the same signs as those in the acoustic wave device 1 according to the preferred embodiment, and explanation for similar component elements will be omitted.

The acoustic wave device 1b according to the first modification is a ladder filter. The acoustic wave device 1b according to the first modification includes an input terminal 15, an output terminal 16, a series arm circuit 12 provided at a first path that electrically connects the input terminal 15 to the output terminal 16, and a plurality of (two) parallel arm circuits 13 and 14 provided at a second path that electrically connects a node on the first path to the ground (ground terminals 17 and 18). The series arm circuit 12 includes a plurality of (three) series arm resonators S1. Each of the parallel arm circuits 13 and 14 includes a parallel arm resonator P1. The ground terminals 17 and 18 may be used as a common ground.

In the acoustic wave device 1b according to the first modification, each of the plurality of series arm resonators S1 and the plurality of parallel arm resonators P1 is a resonator including the first IDT electrode 7A, the second IDT electrode 7B, the piezoelectric layer 5, the first acoustic impedance layer 4A, and the second acoustic impedance layer 4B explained above in the preferred embodiment with reference to FIGS. 1 and 2. Accordingly, in the acoustic wave device 1b according to the first modification, degradation in frequency characteristics is able to be significantly reduced or prevented, and electric power handling capability is able to be further significantly increased.

In the acoustic wave device 1b according to the first modification, in the case where at least one of the plurality of series arm resonators S1 is a resonator including the first IDT electrode 7A, the second IDT electrode 7B, the piezoelectric layer 5, the first acoustic impedance layer 4A, and the second acoustic impedance layer 4B, advantageous effects similar to those in the preferred embodiment can be achieved. Furthermore, the acoustic wave device 1b according to the first modification includes the two parallel arm circuits 13 and 14. However, the number of parallel arm circuits is not necessarily two. For example, the acoustic wave device 1b may include one parallel arm circuit or three or more parallel arm circuits.

(4.2) Second Modification

Figure 8:
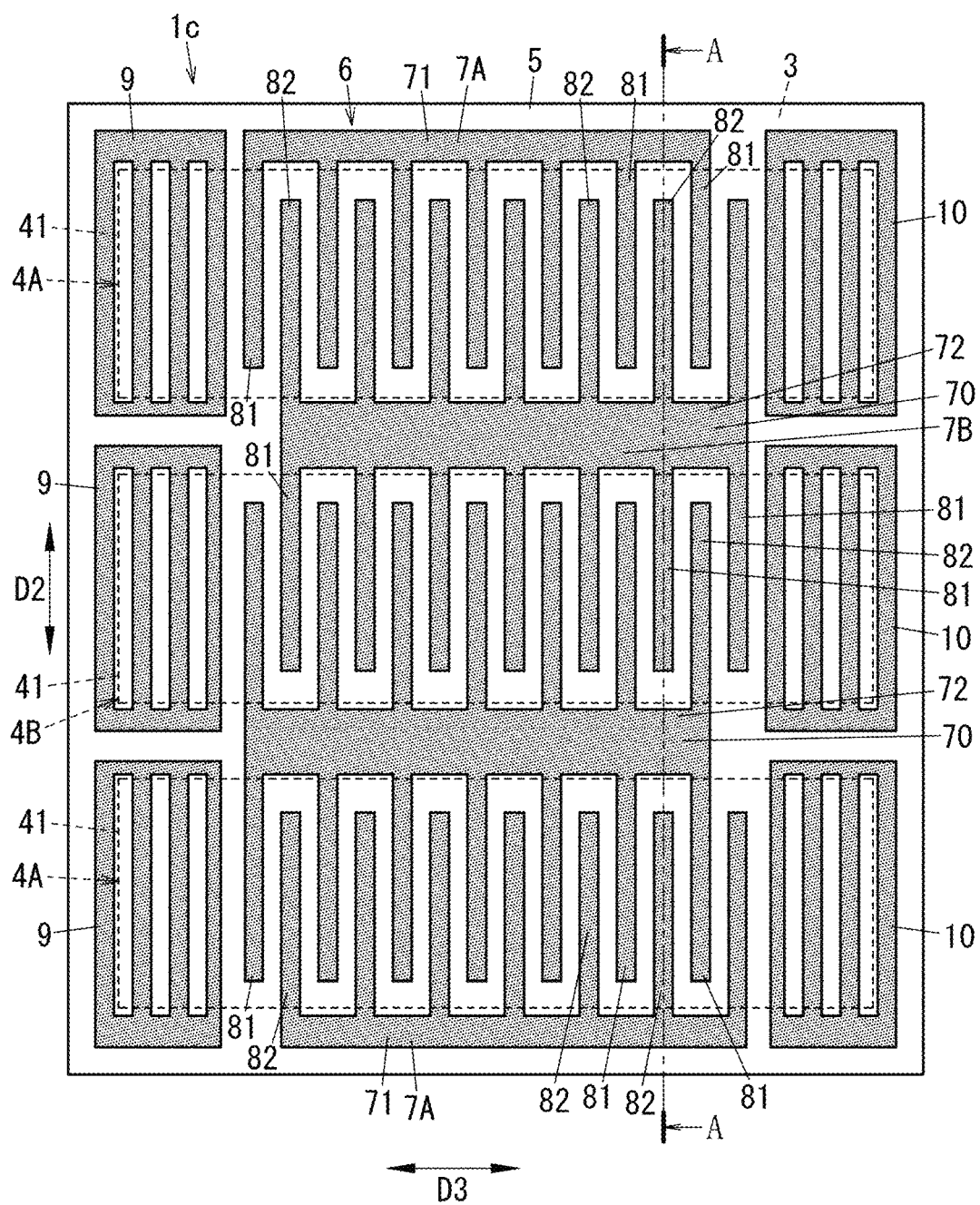
FIG. 8 is a plan view of an acoustic wave device according to a second modification of a preferred embodiment of the present invention.
Figure 9:
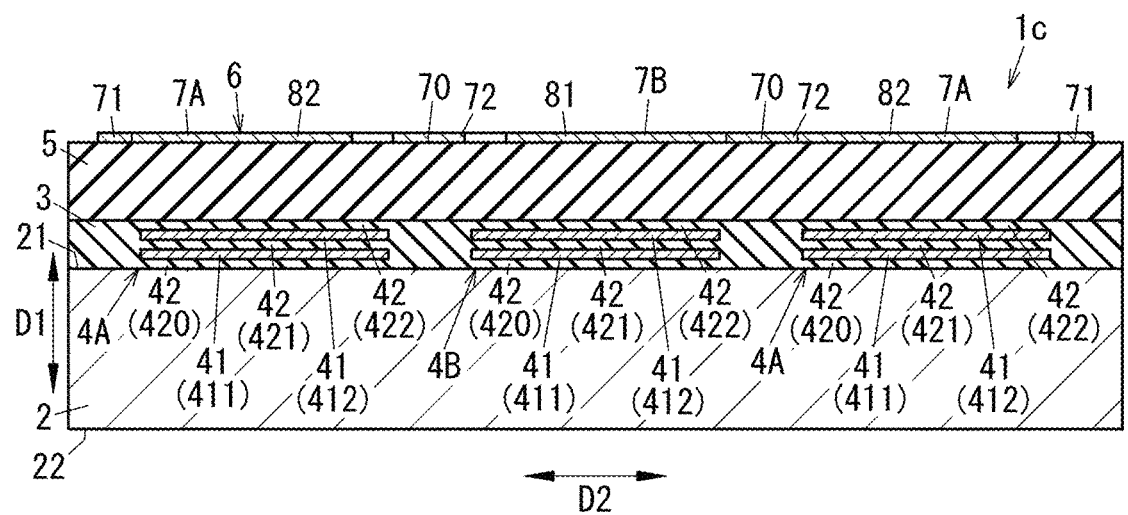
FIG. 9 is a cross-sectional view of the acoustic wave device taken along line A-A in FIG. 8.

An acoustic wave device 1c according to a second modification of a preferred embodiment is different from the acoustic wave device 1 according to the preferred embodiment in that the acoustic wave device 1c includes two first IDT electrodes 7A and the second IDT electrode 7B is located between the two first IDT electrodes 7A, as shown in FIGS. 8 and 9. In the acoustic wave device 1c according to the second modification, component elements the same as or similar to those in the acoustic wave device 1 according to the preferred embodiment will be referred to with the same signs as those in the acoustic wave device 1 according to the preferred embodiment, and explanation for similar component elements will be omitted.

In the acoustic wave device 1c according to the second modification, of the two first IDT electrodes 7A and the second IDT electrode 7B, a first IDT electrode 7A and the second IDT electrode 7B that are adjacent to each other when viewed in plan from the thickness direction D1 of the substrate 2 are electrically connected to each other by the common busbar 70 that is common to the first IDT electrode 7A and the second IDT electrode 7B. Accordingly, the acoustic wave device 1c according to the second modification includes two common busbars 70.

In the acoustic wave device 1c according to the second modification, the first IDT electrode 7A provided in an upper portion of FIG. 8 and the second IDT electrode 7B provided in a middle portion of FIG. 8 include the same common busbar 70. Furthermore, the second IDT electrode 7B provided in the middle portion of FIG. 8 and the first IDT electrode 7A provided in a lower portion of FIG. 8 include the same common busbar 70.

Prior to explanation of the frequency characteristics of the acoustic wave device 1c according to the second modification, an acoustic wave device 100c according to a second comparative example will be explained with reference to FIGS. 10 and 11.

The acoustic wave device 100c according to the second comparative example is different from the acoustic wave device 1c according to the second modification in a pattern of the acoustic impedance layer 4 in the intermediate layer 3. In the acoustic wave device 100c according to the second comparative example, component elements the same as or similar to those in the acoustic wave device 1c according to the second modification will be referred to with the same signs as those in the acoustic wave device 1c according to the second modification, and explanation for similar component elements will be omitted.

Figure 10:
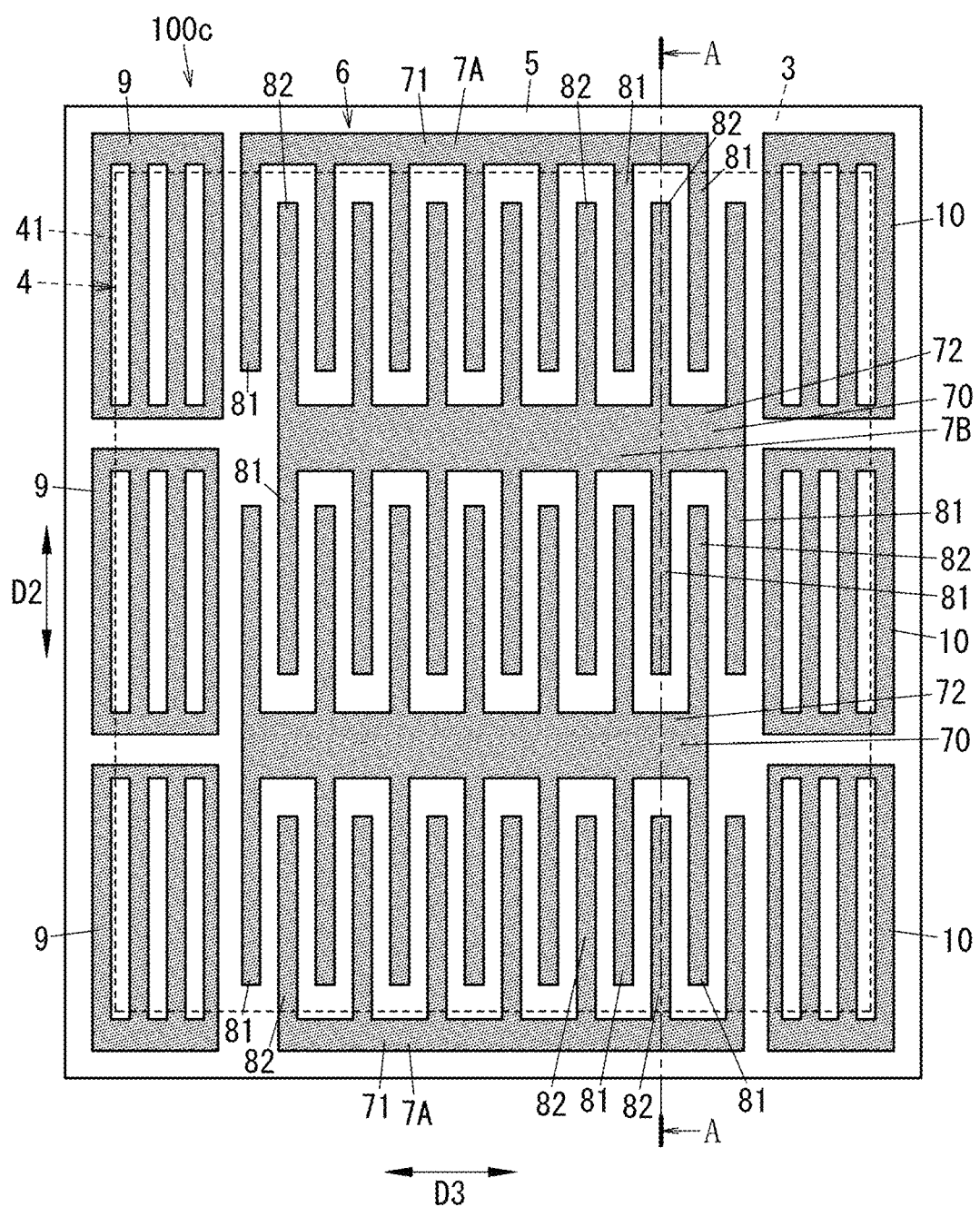
FIG. 10 is a plan view of an acoustic wave device according to a second comparative example.
Figure 11:
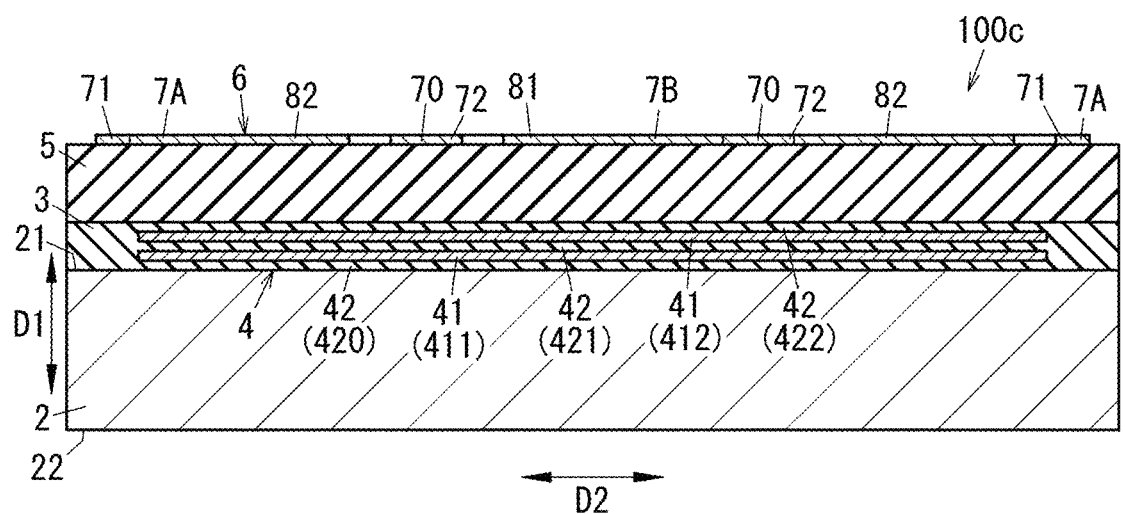
FIG. 11 is a cross-sectional view of the acoustic wave device taken along line A-A in FIG. 10.

In the acoustic wave device 100c according to the second comparative example, when viewed in plan from the thickness direction D1, as shown in FIG. 10, the acoustic impedance layer 4 has a size that overlaps with the two first IDT electrodes 7A and the second IDT electrode 7B and also overlaps with the two common busbars 70.

Figure 12:
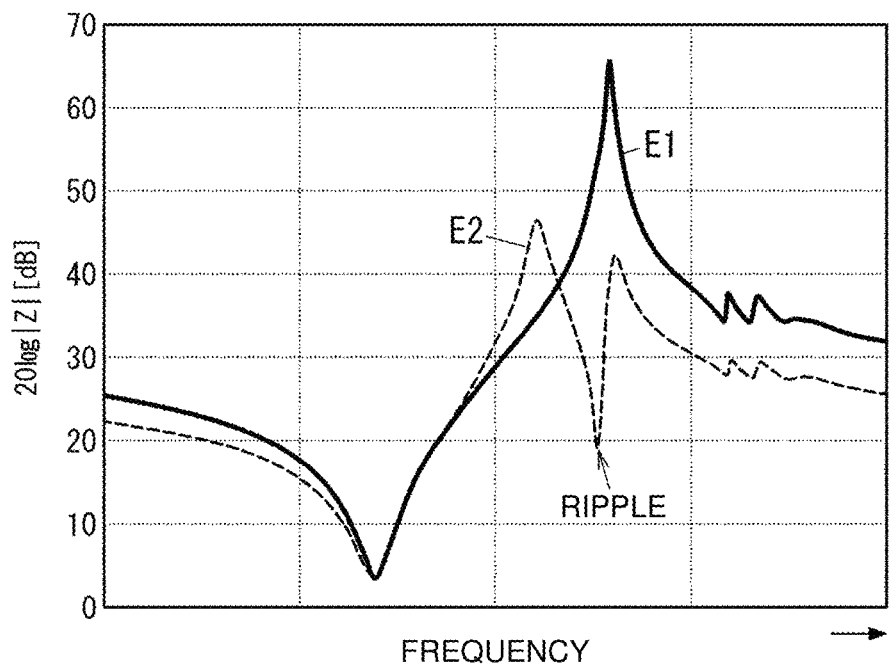
FIG. 12 is a graph of frequency characteristics of impedance of the acoustic wave device according to the second modification of the preferred embodiment of the present invention and frequency characteristics of impedance of the acoustic wave device according to the second comparative example.

In FIG. 12, frequency characteristics of impedance of the acoustic wave device 1c according to the second modification are represented by a solid line E1, and frequency characteristics of impedance of the acoustic wave device 100c according to the second comparative example are represented by a broken line E2. The frequency characteristics of the impedances indicated in FIG. 12 represent measurement results. In FIG. 12, the horizontal axis represents frequency, and the vertical axis represents 20 log|Z| where impedances of the acoustic wave device 1c according to the second modification and the acoustic wave device 100c according to the second comparative example are represented by Z and the size of the impedances is represented by |Z|.

As is clear from FIG. 12, ripples are generated adjacent to or in a vicinity of the resonant frequency in the frequency characteristics of the impedance of the acoustic wave device 100c according to the second comparative example, and generation of ripples adjacent to or in a vicinity of the resonant frequency is significantly reduced or prevented in the acoustic wave device 1c according to the second modification. Therefore, compared to the acoustic wave device 100c according to the second comparative example, the frequency characteristics are significantly improved in the acoustic wave device 1c according to the second modification.

(4.3) Other Modifications

The plan view shape of the substrate 2 when viewed from the thickness direction D1 of the substrate 2 is not limited to a rectangular or substantially rectangular shape and may be, for example, a square or substantially square shape. Furthermore, a material for the substrate 2 is not limited to Si (silicon) and may be, for example, $LiNbO_3$ (lithium niobate), $LiTaO_3$ (lithium tantalate), crystal, glass, or the like.

The number of the high acoustic impedance layers 41 and the number of the low acoustic impedance layers 42 in each of the first acoustic impedance layer 4A and the second acoustic impedance layer 4B are not limited to two and three, respectively, and may be two or more and three or more, respectively. Furthermore, the number of the high acoustic impedance layers 41 and the number of the low acoustic impedance layers 42 are not necessarily different. The number of the high acoustic impedance layers 41 and the number of the low acoustic impedance layers 42 may be the same or the number of the low acoustic impedance layers 42 may be smaller by one than the number of the high acoustic impedance layers 41.

Furthermore, a material for the plurality of high acoustic impedance layers 41 is not limited to Pt (platinum) and may be, for example, W (tungsten) or the like.

Furthermore, the plurality of high acoustic impedance layers 41 do not necessarily include the same material and may include, for example, different materials. Furthermore, the plurality of low acoustic impedance layers 42 do not necessarily include the same material and may include, for example, different materials.

A material for the piezoelectric layer 5 is not limited to $LiNbO_3$ and may be, for example, $LiTaO_3$.

Materials for the functional electrode 6, the reflectors 9, and the reflectors 10 are not limited to Al (aluminum) and may be an Al alloy. Furthermore, materials for the functional electrode 6, the reflectors 9, and the reflectors 10 may be, for example, Cu (copper), Pt (platinum), Au (gold), Ag (silver), Ti (titanium), Ni (nickel), Cr (chromium), Mo (molybdenum), W (tungsten), an alloy of any one of the above metals as a main component, or the like. Furthermore, each of the functional electrode 6, the reflectors 9, and the reflectors 10 does not necessarily have a single-layer structure and may have a multilayer structure.

In the acoustic wave devices 1, 1b, and 1c, the reflectors 9 and the reflectors 10 are not essential component elements.

Furthermore, a parallel arm circuit does not necessarily include a parallel arm resonator and may be include, for example, an inductor, a capacitor, and the like.

The acoustic wave devices 1, 1b, and 1c are not limited to an example in which, when viewed in plan from the thickness direction D1, the entire or substantially the entire prescribed region 11 of the first IDT electrode 7A overlaps with the conductive layers (high acoustic impedance layers 41) in the first acoustic impedance layer 4A. When viewed in plan from the thickness direction D1, a portion of the prescribed region 11 may overlap with the conductive layers (high acoustic impedance layers 41). Furthermore, the acoustic wave devices 1, 1b, and 1c are not limited to an example in which, when viewed in plan from the thickness direction D1, the entire or substantially the entire prescribed region 11 of the second IDT electrode 7B overlaps with the conductive layers (high acoustic impedance layers 41) in the second acoustic impedance layer 4B. When viewed in plan from the thickness direction D1, a portion of the prescribed region 11 may overlap with the conductive layers (high acoustic impedance layers 41). Furthermore, each of the first acoustic impedance layer 4A and the second acoustic impedance layer 4B is not limited to an example in which the high acoustic impedance layers 41 are conductive layers. The low acoustic impedance layers 42 may be conductive layers. With any configurations, when viewed in plan from the thickness direction D1 of the substrate 2, only a configuration in which at least a portion of the conductive layers in the first acoustic impedance layer 4A that overlaps with the first IDT electrode 7A and at least a portion of the conductive layers in the second acoustic impedance layer 4B that overlaps with the second IDT electrode 7B do not overlap with the common busbar 70 and the conductive layers in the first acoustic impedance layer 4A and the conductive layers in the second acoustic impedance layer 4B are electrically insulated from each other needs to be provided. In other words, as long as the conductive layers in the first acoustic impedance layer 4A and the conductive layers in the second acoustic impedance layer 4B are electrically insulated from each other, when viewed in plan from the thickness direction D1 of the substrate 2, at least one of the conductive layers in the first acoustic impedance layer 4A and the conductive layers in the second acoustic impedance layer 4B may overlap with a portion of the common busbar 70.

Furthermore, the functional electrode 6 may include two or more IDT electrodes in addition to the first IDT electrode 7A and the second IDT electrode 7B.

Figure 13:
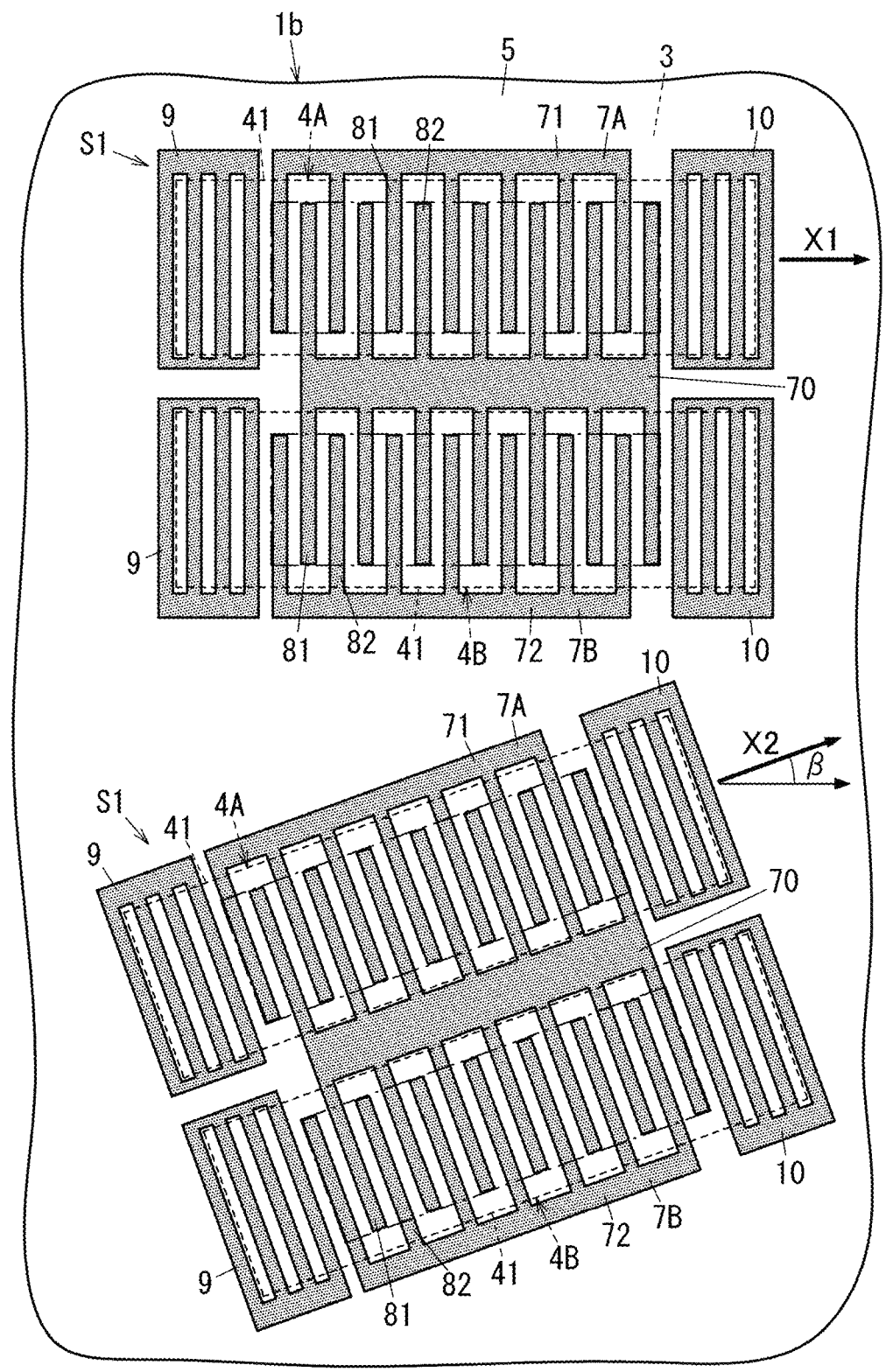
FIG. 13 is a plan view of a partial cut-out of an acoustic wave device according to a third modification of a preferred embodiment of the present invention.

In the acoustic wave device 1b, propagation directions of at least two resonators (for example, the series arm resonators S1 each including the first IDT electrode 7A, the second IDT electrode 7B, the piezoelectric layer 5, the first acoustic impedance layer 4A, and the second acoustic impedance layer 4B) of the plurality of resonators may be different from each other, as in an acoustic wave device 1b according to a third modification shown in FIG. 13. That is, when the propagation direction of acoustic waves in a resonator in an upper portion of FIG. 13 is represented by X1 and the propagation direction of acoustic waves in a resonator in a lower portion of FIG. 13 is represented by X2, the propagation direction X2 forms an angle of $\beta$ with respect to the propagation direction X1. In the Euler angles $(\phi,\theta,\psi)$ of the piezoelectric layer 5, $\psi$ corresponding to a propagation direction may be set to 0° or more and 90° or less. Accordingly, in the acoustic wave device 1b, the band width can be adjusted. At least two resonators having different propagation directions only need to have different propagations. The at least two resonators may have the same or substantially the same features other than the propagation direction or may have different configurations as well as different propagation directions.

Figure 14:
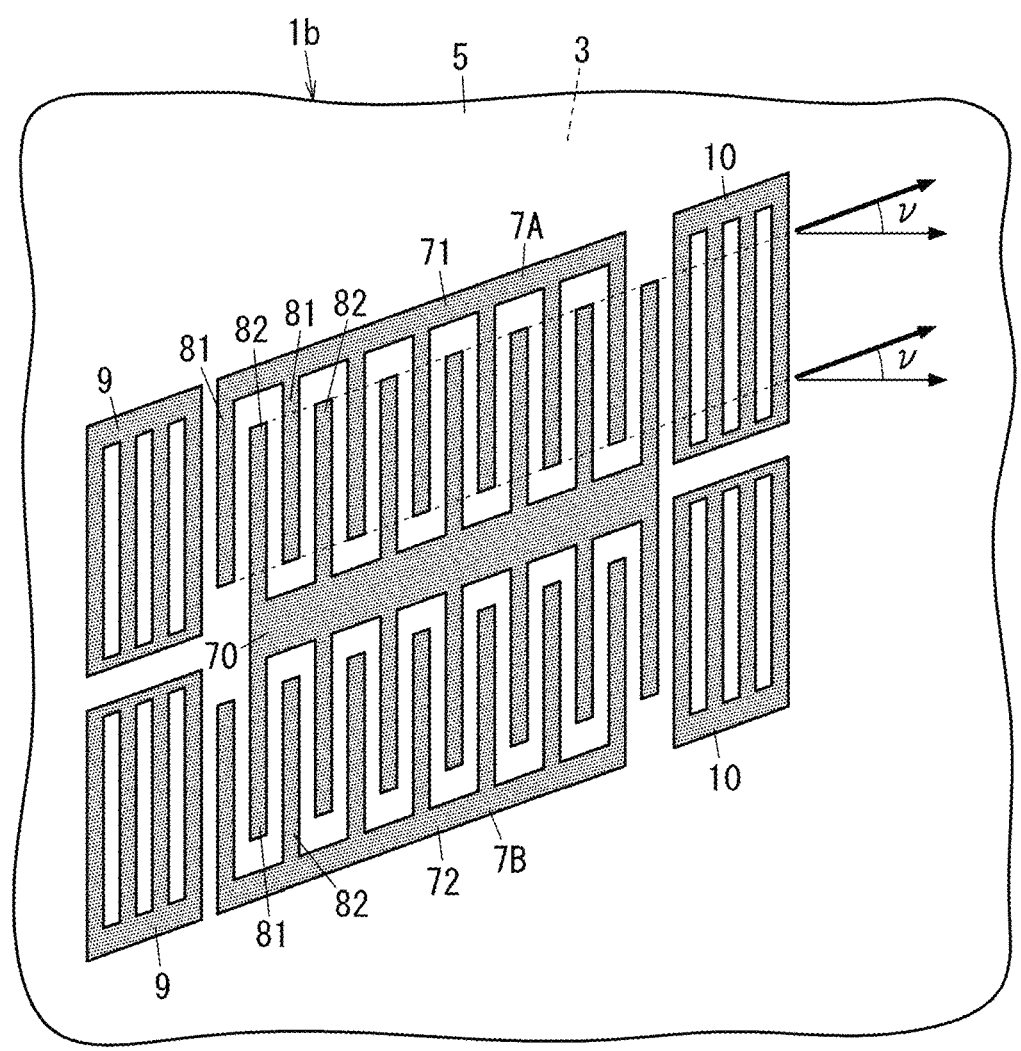
FIG. 14 is a plan view of a partial cut-out of an acoustic wave device according to a fourth modification of a preferred embodiment of the present invention.

In the acoustic wave device 1, a direction in which leading ends of the plurality of electrode fingers 81 are connected may form an angle with an inclination of V with respect to the propagation direction $\psi$ of acoustic waves, as in an acoustic wave device 1b according to a fourth modification shown in FIG. 14. The propagation direction $\psi$ of acoustic waves represents a direction in which acoustic waves excited by the first IDT electrode 7A or the second IDT electrode 7B propagate and is defined by the Euler angles (φ,θ,ψ) of the piezoelectric layer 5. The direction in which the leading ends of the plurality of electrode fingers 82 are connected is parallel or substantially parallel to the direction in which the leading ends of the plurality of electrode fingers 81 are connected. For example, ν may be set to or approximately set to any one of angles 2°, 4°, 6°, 8°, 10°, 12°, 14°, 16°, 18°, 20°, 22°, 24°, 26°, 28°, 30°, 32°, 34°, 36°, 38°, 40°, 42°, 44°, 46°, 48°, and 50°.

Figure 15:
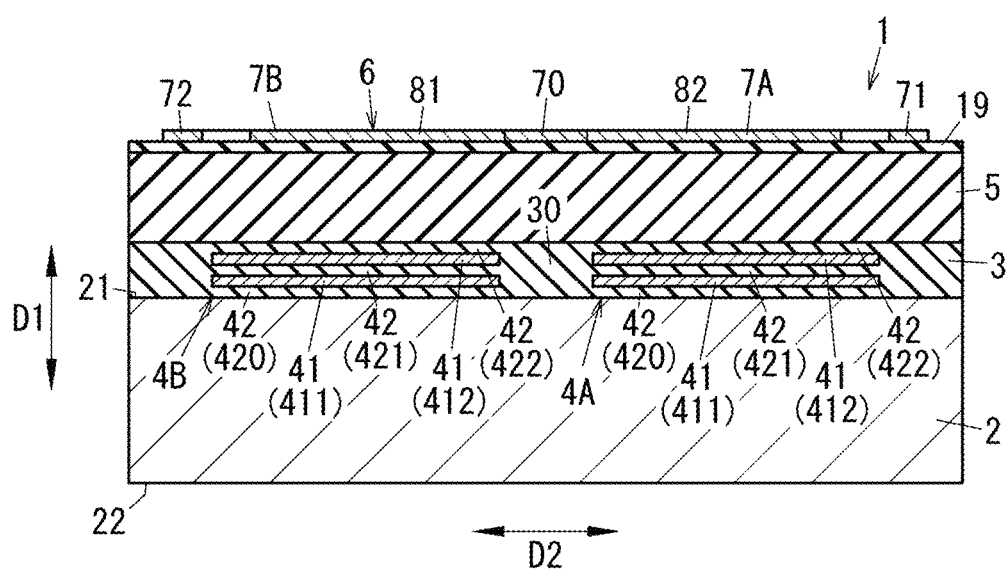
FIG. 15 is a cross-sectional view of an acoustic wave device according to a fifth modification of a preferred embodiment of the present invention.

In the acoustic wave device 1, a dielectric layer 19 made of, for example, silicon oxide may be provided between each of the first IDT electrode 7A and the second IDT electrode 7B, and the piezoelectric layer 5, as in an acoustic wave device 1 according to a fifth modification shown in FIG. 15. In this case, the band width can be adjusted.

Figure 16:
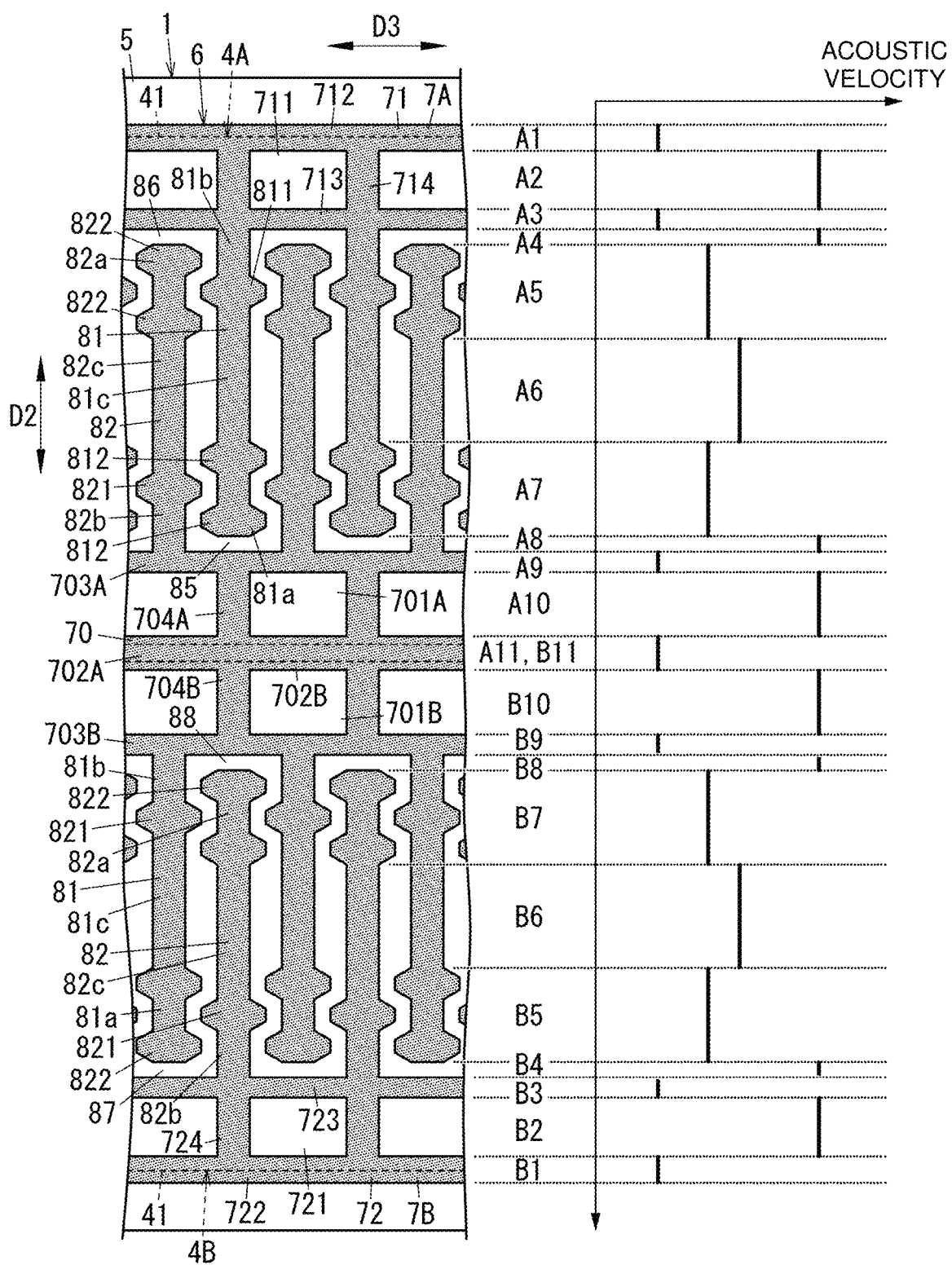
FIG. 16 is a plan view of a partial cut-out of an acoustic wave device according to a sixth modification of a preferred embodiment of the present invention.

In the acoustic wave device 1, the first IDT electrode 7A and the second IDT electrode 7B may define a piston mode, as with an acoustic wave device 1 according to a sixth modification shown in FIG. 16. Hereinafter, the acoustic wave device 1 according to the sixth modification will be explained.

In the first IDT electrode 7A, when a direction orthogonal or substantially orthogonal to a direction in which the electrode fingers 81 extend from the first busbar 71 is defined as a width direction of the electrode fingers 81, leading end portions 81a of the electrode fingers 81 each include a wide-width portion 812 whose size in the width direction is larger than that of a central portion 81c and base end portions 81b of the electrode fingers 81 each include a wide-width portion 811 whose size in the width direction is larger than that of the central portion 81c. In the first IDT electrode 7A, gaps 85 are provided between the electrode fingers 81 and the common busbar 70.

Furthermore, in the first IDT electrode 7A, when a direction orthogonal or substantially orthogonal to a direction in which the electrode fingers 82 extend from the common busbar 70 is defined as the width direction of the electrode fingers 82, leading end portions 82a of the electrode fingers 82 each include a wide-width portion 822 whose size in the width direction is larger than that of a central portion 82c and base end portions 82b of the electrode fingers 82 each include a wide-width portion 821 whose size in the width direction is larger than that of the central portion 82c. In the first IDT electrode 7A, gaps 86 are provided between the electrode fingers 82 and the first busbar 71.

Furthermore, in the first IDT electrode 7A, the first busbar 71 includes a plurality of cavities 711 provided along the longitudinal direction of the first busbar 71. The first busbar 71 includes an inner busbar portion 713, a central busbar portion 714, and an outer busbar portion 712. The inner busbar portion 713 is located closer to the electrode fingers 81 than the cavities 711 are. The central busbar portion 714 includes the plurality of cavities 711 described above. The outer busbar portion 712 is located opposite the inner busbar portion 713 with the central busbar portion 714 interposed therebetween.

Furthermore, in the first IDT electrode 7A, the common busbar 70 includes a plurality of cavities 701A. The plurality of cavities 701A are provided along the longitudinal direction of the common busbar 70. The common busbar 70 includes an inner busbar portion 703A, a central busbar portion 704A, and an outer busbar portion 702A of the first IDT electrode 7A.

Furthermore, in the second IDT electrode 7B, when a direction orthogonal or substantially orthogonal to a direction in which the electrode fingers 81 extend from the common busbar 70 is defined as a width direction of the electrode fingers 81, leading end portions 81a of the electrode fingers 81 each include a wide-width portion 812 whose size in the width direction is larger than that of a central portion 81c and base end portions 81b of the electrode fingers 81 each include a wide-width portion 811 whose size in the width direction is larger than that of the central portion 81c. In the second IDT electrode 7B, gaps 87 are provided between the electrode fingers 81 and the second busbar 72.

Furthermore, in the second IDT electrode 7B, when a direction orthogonal or substantially orthogonal to a direction in which the electrode fingers 82 extend from the second busbar 72 is defined as the width direction of the electrode fingers 82, leading end portions 82a of the electrode fingers 82 each include a wide-width portion 822 whose size in the width direction is larger than that of a central portion 82c and base end portions 82b of the electrode fingers 82 each include a wide-width portion 821 whose size in the width direction is larger than that of the central portion 82c. In the second IDT electrode 7B, gaps 88 are provided between the electrode fingers 82 and the common busbar 70.

Furthermore, in the second IDT electrode 7B, the second busbar 72 includes a plurality of cavities 721 provided along the longitudinal direction of the second busbar 72. The second busbar 72 includes an inner busbar portion 723, a central busbar portion 724, and an outer busbar portion 722. The inner busbar portion 723 is located closer to the electrode fingers 82 than the cavities 721 are. The central busbar portion 724 includes the plurality of cavities 721 described above. The outer busbar portion 722 is located opposite the central busbar portion 724 with the inner busbar portion 723 interposed therebetween.

Furthermore, in the second IDT electrode 7B, the common busbar 70 includes a plurality of cavities 701B. The plurality of cavities 701B is provided along the longitudinal direction of the common busbar 70. The common busbar 70 includes an inner busbar portion 703B, a central busbar portion 704B, and an outer busbar portion 702B of the second IDT electrode 7B.

In FIG. 16, when viewed in plan from the thickness direction of the acoustic wave device 1, eleven regions A1 to A11 associated with the first IDT electrode 7A and eleven regions B1 to B11 associated with the second IDT electrode 7B are provided. However, the region A11 and the region B11 are the same regions. The eleven regions A1 to A11 in the piezoelectric layer 5 and the first IDT electrode 7A include different portions. The ten regions B1 to B10 in the piezoelectric layer 5 and the second IDT electrode 7B include different portions. On the right side of FIG. 16, velocity (acoustic velocity) of acoustic waves propagating in each of the regions A1 to A11 and B1 to B10 is shown.

In the acoustic wave device 1 according to the sixth modification, of the eleven regions A1 to A11 described above, the region A6 located at the center in the second direction D2 defines a first central region. The first central region includes the central portions 81c of the plurality of electrode fingers 81 and the central portions 82c of the plurality of electrode fingers 82. The first central region is a region in which the central portions 81c of the plurality of electrode fingers 81 and the central portions 82c of the plurality of electrode fingers 82 overlap in the third direction D3.

In the acoustic wave device 1 according to the sixth modification, of the eleven regions A1 to A11 described above, the regions A1 and A11 located at both ends in the second direction D2 define first outer busbar regions. The region A1 includes the outer busbar portion 712 of the first busbar 71. The region A11 includes the outer busbar portion 702A of the common busbar 70. The acoustic velocity of acoustic waves in the first outer busbar regions is slower than that in the first central region.

In the acoustic wave device 1 according to the sixth modification, of the eleven regions A1 to A11 described above, the regions A2 and A10 located second from the both ends in the second direction D2 define first connection regions. The region A2 includes the plurality of cavities 711 of the first busbar 71. The region A10 includes the plurality of cavities 701A of the common busbar 70. The acoustic velocity of acoustic waves in the first connection regions is faster than that in the first outer busbar regions and the first central region.

In the acoustic wave device 1 according to the sixth modification, of the eleven regions A1 to A11 described above, the regions A3 and A9 located third from the both ends in the second direction D2 define first inner busbar regions. The region A3 includes the inner busbar portion 713 of the first busbar 71. The region A9 includes the inner busbar portion 703A of the common busbar 70. The acoustic velocity of acoustic waves in the first inner busbar regions is slower than that in the first central region.

In the acoustic wave device 1 according to the sixth modification, of the eleven regions A1 to A11 described above, the regions A4 and A8 located fourth from the both ends in the second direction D2 define first gap regions. The region A4 includes the base end portions 81$b$ of the plurality of electrode fingers 81 and the plurality of gaps 86. The region A8 includes the base end portions 82$b$ of the plurality of electrode fingers 82 and the plurality of gaps 85. The acoustic velocity of acoustic waves in the first gap regions is faster than that in the first inner busbar regions and the first central region.

In the acoustic wave device 1 according to the sixth modification, of the eleven regions A1 to A11 described above, the regions A5 and A7 located fifth from the both ends in the second direction D2 define first wide-width regions. The region A5 includes the wide-width portions 811 of the base end portions 81$b$ of the plurality of electrode fingers 81 and the wide-width portions 822 of the leading end portions 82$a$ of the plurality of electrode fingers 82. The region A7 includes the wide-width portions 812 of the leading end portions 81$a$ of the plurality of electrode fingers 81 and the wide-width portions 821 of the base end portions 82$b$ of the plurality of electrode fingers 82. The acoustic velocity of acoustic waves in the first wide-width regions is slower than that in the first central region.

In the acoustic wave device 1 according to the sixth modification, the first IDT electrode 7A is provided as described above. Accordingly, the low acoustic velocity regions (regions A5 and A7) are present outside the first central region (region A6), and the high acoustic velocity regions A2 and A10 are present outside the low acoustic velocity regions. Therefore, in the acoustic wave device 1, the piston mode can be provided, and transverse mode ripples are able to be significantly reduced or prevented.

Of the eleven regions B1 to B11 described above, the region B6 located at the center in the second direction D2 defines a second central region. The second central region includes the central portions 81$c$ of the plurality of electrode fingers 81 and the central portions 82$c$ of the plurality of electrode fingers 82. The second central region is a region in which the central portions 81$c$ of the plurality of electrode fingers 81 and the central portions 82$c$ of the plurality of electrode fingers 82 overlap in the third direction D3.

In the acoustic wave device 1 according to the sixth modification, of the eleven regions B1 to B11 described above, the regions B1 and B11 located at both ends in the second direction D2 define second outer busbar regions. The region B1 includes the outer busbar portion 722 of the second busbar 72. The region B11 includes the outer busbar portion 702B of the common busbar 70. The acoustic velocity of acoustic waves in the second outer busbar regions is slower than that in the second central region.

In the acoustic wave device 1 according to the sixth modification, of the eleven regions B1 to B11 described above, the regions B2 and B10 located second from the both ends in the second direction D2 define second connection regions. The region B2 includes the plurality of cavities 721 of the second busbar 72. The region B10 includes the plurality of cavities 701B of the common busbar 70. The acoustic velocity of acoustic waves in the second connection regions is faster than that in the second outer busbar regions and the second central region.

In the acoustic wave device 1 according to the sixth modification, of the eleven regions B1 to B11 described above, the regions B3 and B9 located third from the both ends in the second direction D2 define second inner busbar regions. The region B3 includes the inner busbar portion 723 of the second busbar 72. The region B9 includes the inner busbar portion 703B of the common busbar 70. The acoustic velocity of acoustic waves in the second inner busbar regions is slower than that in the second central region.

In the acoustic wave device 1 according to the sixth modification, of the eleven regions B1 to B11 described above, the regions B4 and B8 located fourth from the both ends in the second direction D2 define second gap regions. The region B4 includes the base end portions 81$b$ of the plurality of electrode fingers 81 and the plurality of gaps 87. The region B8 includes the base end portions 82$b$ of the plurality of electrode fingers 82 and the plurality of gaps 88. The acoustic velocity of acoustic waves in the second gap regions is faster than that in the second inner busbar regions and the second central region.

In the acoustic wave device 1 according to the sixth modification, of the eleven regions B1 to B11 described above, the regions B5 and B7 located fifth from the both ends in the second direction D2 define second wide-width regions. The region B5 includes the wide-width portions 811 of the base end portions 81$b$ of the plurality of electrode fingers 81 and the wide-width portions 822 of the leading end portions 82$a$ of the plurality of electrode fingers 82. The region B7 includes the wide-width portions 812 of the leading end portions 81$a$ of the plurality of electrode fingers 81 and the wide-width portions 821 of the base end portions 82$b$ of the plurality of electrode fingers 82. The acoustic velocity of acoustic waves in the second wide-width regions is slower than that in the second central region.

In the acoustic wave device 1 according to the sixth modification, the second IDT electrode 7B is provided as described above. Accordingly, the low acoustic velocity regions (regions B5 and B7) are present outside the second central region (region B6), and the high acoustic velocity regions B2 and B10 are present outside the low acoustic velocity regions. Therefore, in the acoustic wave device 1, the piston mode can be provided, and transverse mode ripples are able to be significantly reduced or prevented.

In the acoustic wave device 1 according to the sixth modification, at least a portion of each of the conductive layers (high acoustic impedance layers 41) in the first acoustic impedance layer 4A and the conductive layers (high acoustic impedance layers 41) in the second acoustic impedance layer 4B does not overlap with the common busbar 70 when viewed in plan from the thickness direction D1 (see FIG. 2) of the substrate 2 (see FIG. 2). In the acoustic wave device 1, the conductive layers (high acoustic impedance layers 41) in the first acoustic impedance layer 4A overlap with a portion of the region A1, the regions A2 to A10, and a portion of the region A11 when viewed in plan from the thickness direction D1 (see FIG. 2) of the substrate 2 (see FIG. 2). Furthermore, the conductive layers (high acoustic impedance layers 41) in the second acoustic impedance layer 4B overlap with a portion of the region B1, the regions B2 to B10, and a portion of the region B11 when viewed in plan from the thickness direction D1 (see FIG. 2) of the substrate 2 (see FIG. 2). In the acoustic wave device 1 shown in FIG. 16, acoustic energy can be locked adjacent to or in a vicinity of the main surface of the piezoelectric layer 5 further efficiently.

Figure 17:
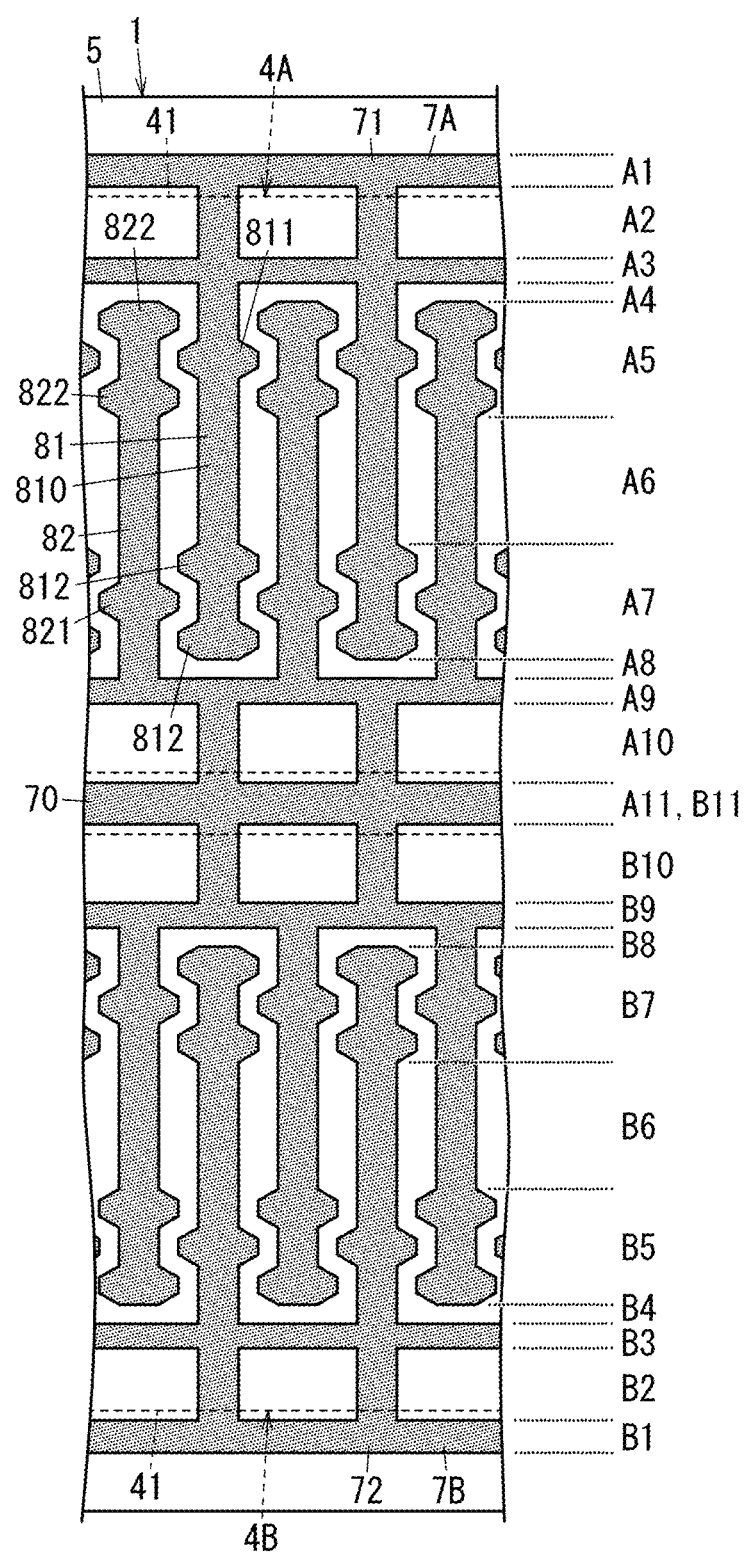
FIG. 17 is a plan view of a partial cut-out of an acoustic wave device according to a seventh modification of a preferred embodiment of the present invention.

In contrast, in an acoustic wave device 1 according to a seventh modification shown in FIG. 17, the conductive layers (high acoustic impedance layers 41) in the first acoustic impedance layer 4A overlap with a portion of the region A2, the regions A3 to A9, and a portion of the region A10 when viewed in plan from the thickness direction D1 (see FIG. 2) of the substrate 2 (see FIG. 2). Furthermore, the conductive layers (high acoustic impedance layers 41) in the second acoustic impedance layer 4B overlap with a portion of the region B2, the regions B3 to B9, and a portion of the region B10 when viewed in plan from the thickness direction D1 (see FIG. 2) of the substrate 2 (see FIG. 2). In the acoustic wave device 1 according to the seventh modification, acoustic energy can be efficiently locked adjacent to or in a vicinity of the main surface of the piezoelectric layer 5, and influence of parasitic capacitance is able to be significantly reduced or prevented compared to the acoustic wave device 1 according to the sixth modification.

Figure 18:
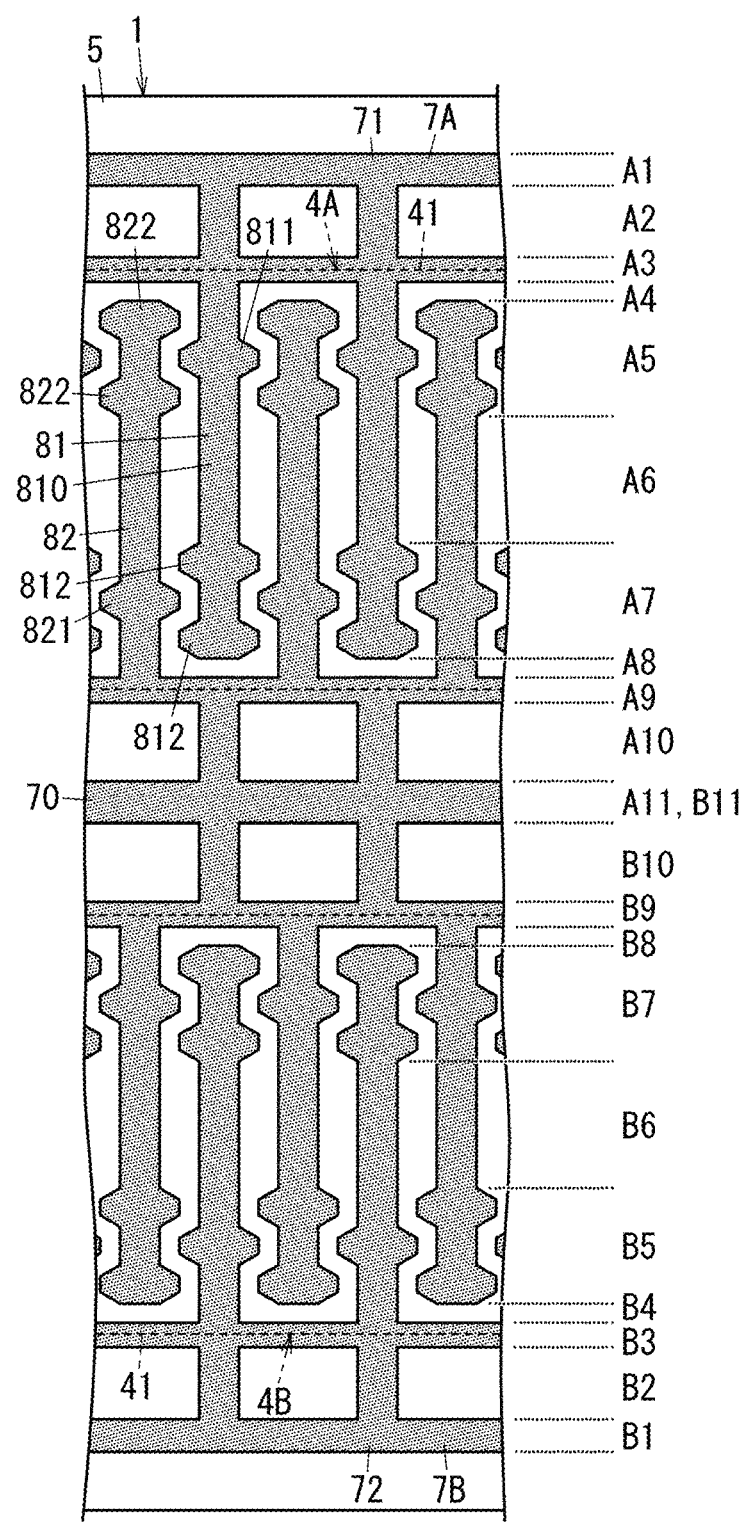
FIG. 18 is a plan view of a partial cut-out of an acoustic wave device according to an eighth modification of a preferred embodiment of the present invention.

Furthermore, in an acoustic wave device 1 according to an eighth modification shown in FIG. 18, the conductive layers (high acoustic impedance layers 41) in the first acoustic impedance layer 4A overlap with a portion of the region A3, the regions A4 to A8, and a portion of the region A9 when viewed in plan from the thickness direction D1 (see FIG. 2) of the substrate 2 (see FIG. 2). Furthermore, the conductive layers (high acoustic impedance layers 41) in the second acoustic impedance layer 4B overlap with a portion of the region B3, the regions B4 to B8, and a portion of the region B9 when viewed in plan from the thickness direction D1 (see FIG. 2) of the substrate 2 (see FIG. 2). In the acoustic wave device 1 according to the eighth modification, acoustic energy can be appropriately locked adjacent to or in a vicinity of the main surface of the piezoelectric layer 5, and influence of parasitic capacitance is able to be significantly reduced compared to the acoustic wave device 1 according to the seventh modification.

Figure 19:
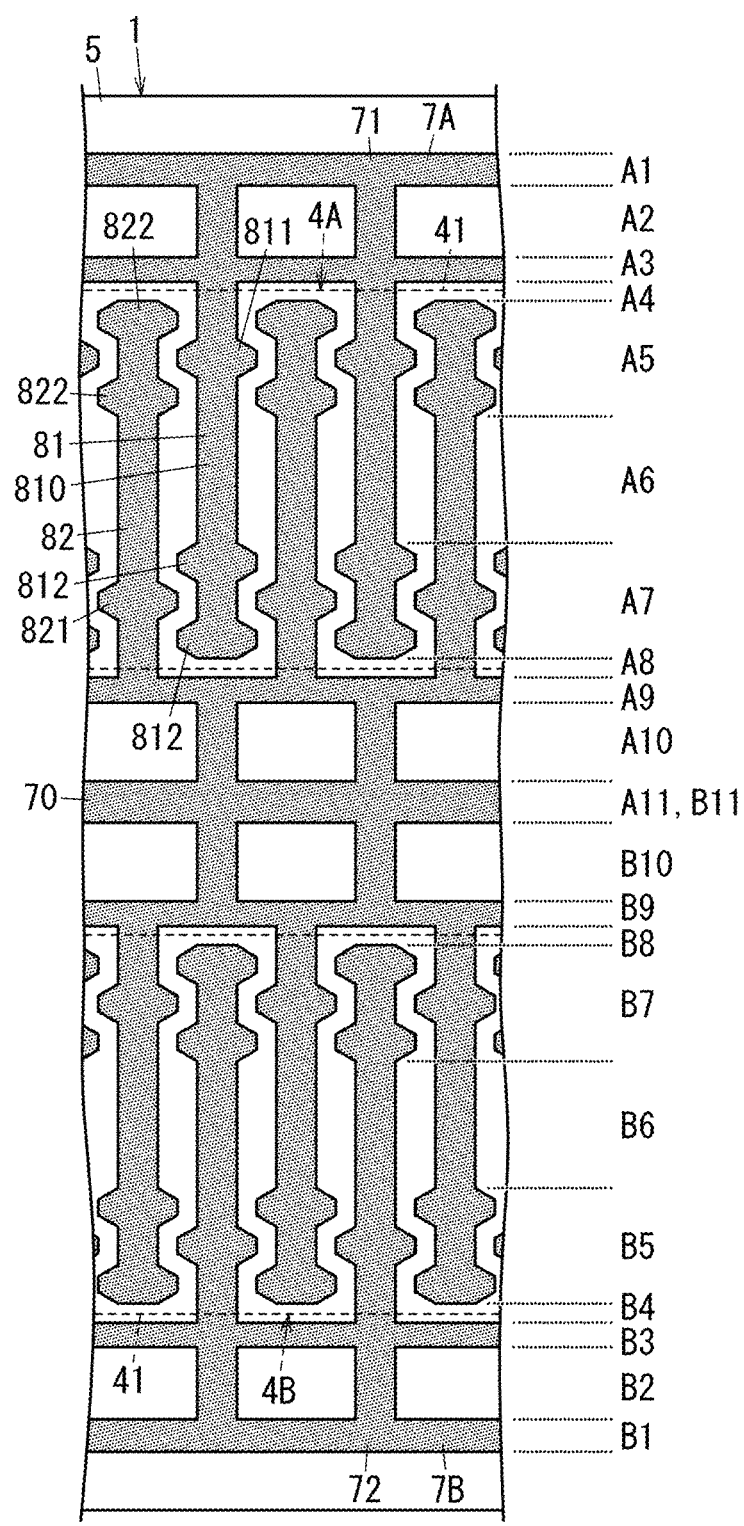
FIG. 19 is a plan view of a partial cut-out of an acoustic wave device according to a ninth modification of a preferred embodiment of the present invention.

Furthermore, in an acoustic wave device 1 according to a ninth modification shown in FIG. 19, the conductive layers (high acoustic impedance layers 41) in the first acoustic impedance layer 4A overlap with a portion of the region A4, the regions A5 to A7, and a portion of the region A8 when viewed in plan from the thickness direction D1 (see FIG. 2) of the substrate 2 (see FIG. 2). Furthermore, the conductive layers (high acoustic impedance layers 41) in the second acoustic impedance layer 4B overlap with a portion of the region B4, the regions B5 to B7, and a portion of the region B8 when viewed in plan from the thickness direction D1 (see FIG. 2) of the substrate 2 (see FIG. 2). In the acoustic wave device 1 according to the ninth modification, minimum necessary acoustic energy can be locked adjacent to or in a vicinity of the main surface of the piezoelectric layer 5, and influence of parasitic capacitance is able to be significantly reduced or prevented compared to the acoustic wave device 1 according to the eighth modification.

Figure 20:
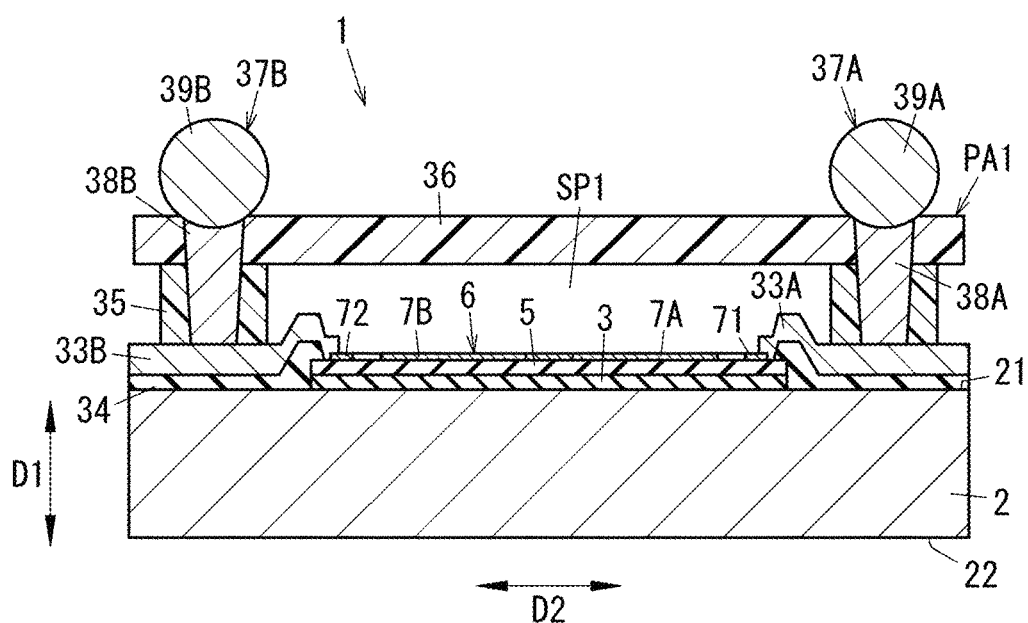
FIG. 20 is a cross-sectional view of an acoustic wave device according to a tenth modification of a preferred embodiment of the present invention.

An acoustic wave device 1 according to a tenth modification may further include, as shown in FIG. 20, a plurality of (in the example shown in FIG. 20, two) wiring layers 33A and 33B, an insulating layer 34, a spacer layer (supporting layer) 35, and a cover member 36. In the acoustic wave device 1 according to the tenth modification, the first IDT electrode 7A, the second IDT electrode 7B, the piezoelectric layer 5, and the intermediate layer 3 may be accommodated in a package PA1 including the substrate 2, the insulating layer 34, the spacer layer 35, and the cover member 36. The wiring layer 33A is electrically connected to the first busbar 71 of the first IDT electrode 7A. The wiring layer 33B is electrically connected to the second busbar 72 of the second IDT electrode 7B. The insulating layer 34 is provided on the first main surface 21 of the substrate 2. The insulating layer 34 surrounds the intermediate layer 3 and the piezoelectric layer 5. At least a portion of the spacer layer 35 is provided on the insulating layer 34. The spacer layer 35 surrounds the intermediate layer 3 and the piezoelectric layer 5 when viewed in plan from the thickness direction D1 of the substrate 2. The cover member 36 is provided on the spacer layer 35. In the acoustic wave device 1, the spacer layer 35 is located between the insulating layer 34 and the periphery of the cover member 36. The cover member 36 is separated from the first IDT electrode 7A and the second IDT electrode 7B in the thickness direction D1.

The acoustic wave device 1 according to the tenth modification includes a space SP1 surrounded by the cover member 36, the spacer layer 35, the insulating layer 34, and a multilayer body on the substrate 2 (multilayer body including the intermediate layer 3 and the piezoelectric layer 5).

The insulating layer 34 has electrical insulation characteristics. The insulating layer 34 is provided on the first main surface 21 of the substrate 2 along the outer periphery of the substrate 2. The insulating layer 34 surrounds sides of the intermediate layer 3 and sides of the piezoelectric layer 5. A portion of the insulating layer 34 overlaps with the periphery of the piezoelectric layer 5. The sides of the intermediate layer 3 and the sides of the piezoelectric layer 5 are covered with the insulating layer 34. A material for the insulating layer 34 is preferably, for example, an epoxy resin, a synthetic resin such as polyimide.

The wiring layer 33A overlaps with a portion of the first IDT electrode 7A, a portion of the piezoelectric layer 5, and a portion of the insulating layer 34 in the thickness direction D1 of the substrate 2. The wiring layer 33B overlaps with a portion of the second IDT electrode 7B, a portion of the piezoelectric layer 5, and a portion of the insulating layer 34 in the thickness direction D1 of the substrate 2.

The spacer layer 35 surrounds the piezoelectric layer 5 when viewed in plan. The spacer layer 35 overlaps with the insulating layer 34 in the thickness direction D1 of the substrate 2. A portion of the spacer layer 35 also covers portions of the wiring layers 33A and 33B that are provided on the insulating layer 34. In short, the spacer layer 35 includes a first portion that is provided directly on the insulating layer 34 and a second portion that is provided indirectly on the insulating layer 34 with portions of the wiring layers 33A and 33B located therebetween.

The spacer layer 35 has electrical insulation characteristics. A material for the spacer layer 35 is preferably, for example, an epoxy resin or a synthetic resin such as polyimide. Preferably, a main component of the material for the spacer layer 35 is the same or substantially the same as that of the insulating layer 34, and the spacer layer 35 preferably includes the same or substantially the same material as that of the insulating layer 34, for example.

The cover member 36 has a plate shape. The cover member 36 is separated from the first IDT electrode 7A and the second IDT electrode 7B in the thickness direction D1.

Furthermore, the acoustic wave device 1 according to the tenth modification includes a plurality of (in the example shown in FIG. 20, two) external connection electrodes 37A and 37B. The external connection electrode 37A is electrically connected to the first busbar 71 of the first IDT electrode 7A. The wiring layer 33A described above allows electrical connection between the external connection electrode 37A and the first IDT electrode 7A. The external connection electrode 37B is electrically connected to the second busbar 72 of the second IDT electrode 7B. The wiring layer 33B described above allows electrical connection between the external connection electrode 37B and the second IDT electrode 7B.

The external connection electrodes 37A and 37B include through-electrode portions 38A and 38B, respectively, that penetrate through the spacer layer 35 and the cover member 36 in the thickness direction D1 of the substrate 2 and 39A and 39B, respectively, provided on the through-electrode portions 38A and 38B, respectively.

In the acoustic wave device 1 according to the tenth modification, the spacer layer 35 is provided on the insulating layer 34. However, the spacer layer 35 is not necessarily provided on the insulating layer 34. The spacer layer 35 may be provided on the first main surface 21 of the substrate 2 to surround the piezoelectric layer 5. The features of the package PA1 of the acoustic wave device 1 according to the tenth modification may be changed appropriately to be applied to the acoustic wave device 1b according to the first modification.

Figure 21:
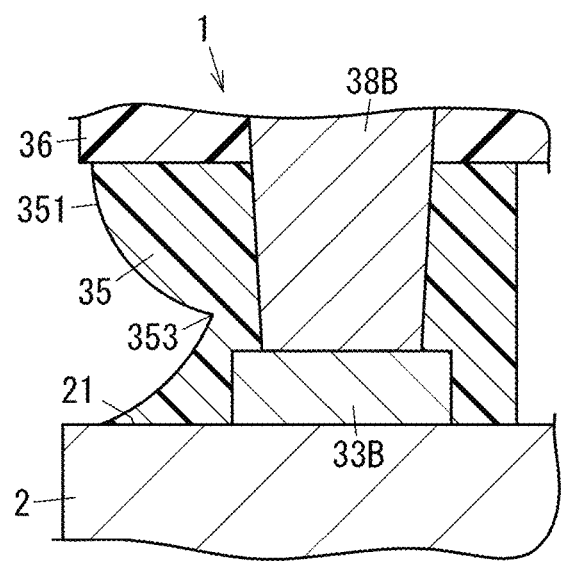
FIG. 21 is a cross-sectional view of a partial cut-out of an acoustic wave device according to an eleventh modification of a preferred embodiment of the present invention.

Furthermore, in an acoustic wave device 1 according to an eleventh modification, as shown in FIG. 21, the spacer layer 35 is provided on the first main surface 21 of the substrate 2 and the wiring layer 33B to surround the piezoelectric layer 5 and includes a recessed portion 353 at an outer surface 351 of the spacer layer 35. In the configuration of FIG. 21, the substrate 2 has electrical insulation characteristics. A material for the substrate 2 is preferably, for example, LiNbO$_3$ (lithium niobate), LiTaO$_3$ (lithium tantalate), crystal, glass, or the like.

Furthermore, an acoustic wave device 1 according to a twelfth modification includes one or more intermediate supporting layers (second spacer layers) that are located inside the spacer layer 35 (first spacer layer) and between the cover member 36 and the substrate 2.

Furthermore, a plurality of acoustic wave devices 1 may be provided as acoustic wave devices. The plurality of acoustic wave devices 1 may share a single substrate 2 and include a resin layer that allows connection between spacer layers 35 of adjacent acoustic wave devices 1. The resin layer includes the same or substantially the same material as that of the spacer layers 35 and is provided integrally with the spacer layers 35. Furthermore, the acoustic wave devices 1 may include a resin layer that extends from the spacer layers 35 located inward than the outer periphery of the substrate 2, which has a rectangular or substantially rectangular shape, to a corner portion of the substrate 2, when viewed in plan from the thickness direction D1 of the substrate 2.

Aspects described below are disclosed in preferred embodiments and so on explained above.

An acoustic wave device (1; 1b; 1c) according to a preferred embodiment of the present invention includes a substrate (2), a first acoustic impedance layer (4A), a second acoustic impedance layer (4B), a piezoelectric layer (5), a first IDT electrode (7A), and a second IDT electrode (7B). The first acoustic impedance layer (4A) and the second acoustic impedance layer (4B) are provided on the substrate (2). The piezoelectric layer (5) is provided on the first acoustic impedance layer (4A) and the second acoustic impedance layer (4B). The first IDT electrode (7A) is provided on the piezoelectric layer (5) and partially overlaps with the first acoustic impedance layer (4A) when viewed in plan from a thickness direction (D1) of the piezoelectric layer (5). The second IDT electrode (7B) is provided on the piezoelectric layer (5) and partially overlaps with the second acoustic impedance layer (4B) when viewed in plan from the thickness direction (D1). The first IDT electrode (7A) and the second IDT electrode (7B) are electrically connected in series with each other by a common busbar (70) that is common to the first IDT electrode (7A) and the second IDT electrode (7B). The first IDT electrode (7A) includes a first busbar (71) and the common busbar (70) that face each other, a plurality of electrode fingers (81) that are connected to the first busbar (71) and extend towards the common busbar (70), and a plurality of electrode fingers (82) that are connected to the common busbar (70) and extend towards the first busbar (71). The second IDT electrode (7B) includes the common busbar (70) and a second busbar (72) that face each other, a plurality of electrode fingers (81) that are connected to the common busbar (70) and extend towards the second busbar (72), and a plurality of electrode fingers (82) that are connected to the second busbar (72) and extend towards the common busbar (70). Each of the first acoustic impedance layer (4A) and the second acoustic impedance layer (4B) includes at least one high acoustic impedance layer (41) and at least one low acoustic impedance layer (42) with an acoustic impedance lower than that of the at least one high acoustic impedance layer (41). In each of the first acoustic impedance layer (4A) and the second acoustic impedance layer (4B), at least one of the at least one high acoustic impedance layer (41) and the at least one low acoustic impedance layer (42) is a conductive layer. At least a portion of each of the conductive layer (high acoustic impedance layer 41) in the first acoustic impedance layer (4A) and the conductive layer (high acoustic impedance layer 41) in the second acoustic impedance layer (4B) does not overlap with the common busbar (70) when viewed in plan from the thickness direction (D1). The conductive layer (high acoustic impedance layer 41) in the first acoustic impedance layer (4A) and the conductive layer (high acoustic impedance layer 41) in the second acoustic impedance layer (4B) are electrically insulated from each other.

In the acoustic wave device (1; 1b; 1c) described above, degradation in frequency characteristics is able to be significantly reduced or prevented, and electric power handling capability is able to be further significantly increased.

In an acoustic wave device (1; 1b; 1c) according to a preferred embodiment of the present invention, the at least one high acoustic impedance layer (41) includes a plurality of high acoustic impedance layers (41). The at least one low acoustic impedance layer (42) includes a plurality of low acoustic impedance layers (42). The plurality of high acoustic impedance layers (41) and the plurality of low acoustic impedance layers (42) are provided alternately one by one in the thickness direction (D1).

In the acoustic wave device (1; 1b; 1c) described above, resonance characteristics can be significantly improved.

In an acoustic wave device (1; 1b; 1c) according to a preferred embodiment of the present invention, the plurality of high acoustic impedance layers (41) in each of the first acoustic impedance layer (4A) and the second acoustic impedance layer (4B) include the conductive layer (high acoustic impedance layer 41).

In an acoustic wave device (1; 1b; 1c) according to a preferred embodiment of the present invention, a material having a conductivity is not necessarily used as a material for the low acoustic impedance layer (42). Therefore, an acoustic impedance ratio, which is a ratio of an acoustic impedance of the high acoustic impedance layer (41) to an acoustic impedance of the low acoustic impedance layer (42), is able to be further significantly increased.

In an acoustic wave device (1; 1b; 1c) according to a preferred embodiment of the present invention, the first IDT electrode (7A; 7AA), the piezoelectric layer (5), and the first acoustic impedance layer (4A) define a first resonator. The second IDT electrode (7B; 7BB), the piezoelectric layer (5), and the second acoustic impedance layer (4B) define a second resonator. The first resonator and the second resonator are division resonators obtained by dividing a prescribed resonator into two resonators, the prescribed resonator including an IDT electrode, a piezoelectric layer, and an acoustic impedance layer, and a combined impedance of an impedance of the first resonator and an impedance of the second resonator is equal or substantially equal to an impedance of the prescribed resonator.

In the acoustic wave device (1; 1b; 1c) described, an area of a region including the first resonator and the second resonator is larger than an area of the prescribed resonator. Therefore, heat dissipation increases. Thus, degradation in frequency characteristics is able to be significantly reduced or prevented, and electric power handling capability is able to be further significantly increased.

In an acoustic wave device (1; 1b; 1c) according to a preferred embodiment of the present invention, the conductive layer (high acoustic impedance layer 41) in the first acoustic impedance layer (4A) is located between the first busbar (71) and the common busbar (70) of the first IDT electrode (7A, 7AA) when viewed in plan from the thickness direction (D1). Furthermore, the conductive layer (high acoustic impedance layer 41) in the second acoustic impedance layer (4B) is located between the common busbar (70) and the second busbar (72) of the second IDT electrode (7B; 7BB) when viewed in plan from the thickness direction (D1).

In the acoustic wave device (1; 1b; 1c) described above, degradation in frequency characteristics is able to be further significantly reduced or prevented.

In an acoustic wave device (1; 1b; 1c) according to a preferred embodiment of the present invention, when viewed in plan from the thickness direction (D1), an area of a region in which the first IDT electrode (7A; 7AA) and the conductive layer (high acoustic impedance layer 41) in the first acoustic impedance layer (4A) overlap and an area of a region in which the second IDT electrode (7B; 7BB) and the conductive layer (high acoustic impedance layer 41) in the second acoustic impedance layer (4B) overlap are the same or substantially the same.

In the acoustic wave device (1; 1b; 1c) described above, generation of ripples in frequency characteristics of impedance is able to be further significantly reduced or prevented.

An acoustic wave device (1b) according to a preferred embodiment of the present invention, includes a series arm circuit (12) provided at a first path that electrically connects an input terminal (15) to an output terminal (16) and a parallel arm circuit (13, 14) provided at a second path that electrically connects a node on the first path to a ground. The series arm circuit (12) includes a plurality of series arm resonators (S1). At least one of the plurality of series arm resonators (S1) is a resonator that includes the first IDT electrode (7A), the second IDT electrode (7B), the piezoelectric layer (5), the first acoustic impedance layer (4A), and the second acoustic impedance layer (4B).

In the acoustic wave device (1b) described above, degradation in frequency characteristics is able to be significantly reduced or prevented, and electric power handling capability is able to be further significantly increased.

In an acoustic wave device (1b) according to a preferred embodiment of the present invention, the parallel arm circuit (13, 14) includes a parallel arm resonator (P1).

In an acoustic wave device (1; 1b; 1c) according to a preferred embodiment of the present invention, when a wave length of acoustic waves defined by an electrode finger pitch (2×T1) of the first IDT electrode (7A) and the second IDT electrode (7B) is represented by $\lambda$, a thickness of the piezoelectric layer (5) is about 1$\lambda$ or less.

In the acoustic wave device (1; 1b; 1c) described above, plate waves can be excited.

In an acoustic wave device (1; 1b; 1c) according to a preferred embodiment of the present invention, the acoustic waves are plate waves.

The acoustic wave device (1; 1b; 1c) described may be used as an acoustic wave device that uses plate waves.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a substrate;
   a first acoustic impedance layer and a second acoustic impedance layer that on the substrate;
   a piezoelectric layer on the first acoustic impedance layer and the second acoustic impedance layer;
   a first IDT (interdigital transducer) electrode on the piezoelectric layer and partially overlapping with the first acoustic impedance layer when viewed in plan from a thickness direction of the piezoelectric layer; and
   a second IDT electrode on the piezoelectric layer and partially overlapping with the second acoustic impedance layer when viewed in plan from the thickness direction; wherein
   the first IDT electrode and the second IDT electrode are electrically connected in series with each other by a common busbar that is common to the first IDT electrode and the second IDT electrode;
   the first IDT electrode includes:
      a first busbar and the common busbar that face each other;
      a plurality of electrode fingers that are connected to the first busbar and extend towards the common busbar; and
      a plurality of electrode fingers that are connected to the common busbar and extend towards the first busbar;
   the second IDT electrode includes:
      the common busbar and a second busbar that face each other;
      a plurality of electrode fingers that are connected to the common busbar and extend towards the second busbar; and a plurality of electrode fingers that are connected to the second busbar and extend towards the common busbar;

each of the first acoustic impedance layer and the second acoustic impedance layer includes:
  at least one high acoustic impedance layer; and
  at least one low acoustic impedance layer with an acoustic impedance lower than that of the at least one high acoustic impedance layer;

in each of the first acoustic impedance layer and the second acoustic impedance layer, at least one of the at least one high acoustic impedance layer and the at least one low acoustic impedance layer is a conductive layer;

at least a portion of the conductive layer in the first acoustic impedance layer and at least a portion of the conductive layer in the second acoustic impedance layer do not overlap with the common busbar when viewed in plan from the thickness direction; and the conductive layer in the first acoustic impedance layer and the conductive layer in the second acoustic impedance layer are electrically insulated from each other.

2. The acoustic wave device according to claim 1, wherein the at least one high acoustic impedance layer includes a plurality of high acoustic impedance layers;
the at least one low acoustic impedance layer includes a plurality of low acoustic impedance layers; and
the plurality of high acoustic impedance layers and the plurality of low acoustic impedance layers are provided alternately one by one in the thickness direction.

3. The acoustic wave device according to claim 2, wherein the plurality of high acoustic impedance layers in each of the first acoustic impedance layer and the second acoustic impedance layer include the conductive layer.

4. The acoustic wave device according to claim 1, wherein the first IDT electrode, the piezoelectric layer, and the first acoustic impedance layer define a first resonator;
the second IDT electrode, the piezoelectric layer, and the second acoustic impedance layer define a second resonator;
the first resonator and the second resonator are division resonators obtained by dividing a prescribed resonator into two resonators, the prescribed resonator including an IDT electrode, a piezoelectric layer, and an acoustic impedance layer; and
a combined impedance of an impedance of the first resonator and an impedance of the second resonator is equal or substantially equal to an impedance of the prescribed resonator.

5. The acoustic wave device according to claim 1, wherein the conductive layer in the first acoustic impedance layer is located between the first busbar and the common busbar of the first IDT electrode when viewed in plan from the thickness direction; and
the conductive layer in the second acoustic impedance layer is located between the common busbar and the second busbar of the second IDT electrode when viewed in plan from the thickness direction.

6. The acoustic wave device according to claim 1, wherein when viewed in plan from the thickness direction, an area of a region in which the first IDT electrode and the conductive layer in the first acoustic impedance layer overlap and an area of a region in which the second IDT electrode and the conductive layer in the second acoustic impedance layer overlap are the same or substantially the same.

7. The acoustic wave device according to claim 1, further comprising:
a series arm circuit provided at a first path electrically connecting an input terminal to an output terminal; and
a parallel arm circuit provided at a second path electrically connecting a node on the first path to a ground; wherein
the series arm circuit includes a plurality of series arm resonators; and
at least one of the plurality of series arm resonators is a resonator including the first IDT electrode, the second IDT electrode, the piezoelectric layer, the first acoustic impedance layer, and the second acoustic impedance layer.

8. The acoustic wave device according to claim 7, wherein the parallel arm circuit includes a parallel arm resonator.

9. The acoustic wave device according to claim 1, wherein when a wave length of acoustic waves defined by an electrode finger pitch of the first IDT electrode and the second IDT electrode is represented by $\lambda$, a thickness of the piezoelectric layer is about $1\lambda$ or less.

10. The acoustic wave device according to claim 9, wherein the acoustic waves are plate waves.

11. The acoustic wave device according to claim 9, wherein a thickness of the substrate is equal to or more than about $10\lambda$.

12. The acoustic wave device according to claim 1, further comprising:
a first pair of reflectors provided on each side of the first IDT electrode in an acoustic wave propagation direction; and
a second pair of reflectors provided on each side of the second IDT electrode in the acoustic wave propagation direction.

13. The acoustic wave device according to claim 1, wherein a resistivity of the substrate is equal to or more than about 100 $\Omega$cm and less than or equal to about 1,000 $\Omega$cm.

14. The acoustic wave device according to claim 1, wherein each of the at least one high acoustic impedance layer includes platinum.

15. The acoustic wave device according to claim 1, wherein each of the at least one high acoustic impedance layer has a surface roughness less than or equal to about 100 nm.

16. The acoustic wave device according to claim 1, wherein each of the at least one low acoustic impedance layer includes silicon oxide.

17. The acoustic wave device according to claim 1, wherein each of the at least one low acoustic impedance layer has a surface roughness less than or equal to about 100 nm.

18. The acoustic wave device according to claim 1, wherein Euler angles of the piezoelectric layer are between about 0° and about 90°.

* * * * *